US011706967B2

(12) United States Patent
Lim et al.

(10) Patent No.: US 11,706,967 B2
(45) Date of Patent: Jul. 18, 2023

(54) DISPLAY APPARATUS INCLUDING LIGHT-CONDENSING LAYER ON SENSOR ELECTRODE LAYER AND METHOD OF MANUFACTURING THE SAME

(71) Applicant: SAMSUNG DISPLAY CO., LTD., Yongin-si (KR)

(72) Inventors: Jaeik Lim, Yongin-si (KR); Seongjun Lee, Yongin-si (KR); Hyungseok Lee, Yongin-si (KR); Jaebum Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/850,318

(22) Filed: Jun. 27, 2022

(65) Prior Publication Data

US 2023/0106948 A1    Apr. 6, 2023

(30) Foreign Application Priority Data

Oct. 5, 2021   (KR) .......................... 10-2021-0131971

(51) Int. Cl.
| | |
|---|---|
| G06F 3/044 | (2006.01) |
| H10K 59/40 | (2023.01) |
| H10K 50/858 | (2023.01) |
| H10K 50/80 | (2023.01) |
| H10K 59/122 | (2023.01) |
| H10K 71/00 | (2023.01) |
| H10K 59/12 | (2023.01) |

(52) U.S. Cl.
CPC ........... *H10K 59/40* (2023.02); *G06F 3/0446* (2019.05); *H10K 50/858* (2023.02); *H10K 50/868* (2023.02); *H10K 59/122* (2023.02); *H10K 71/00* (2023.02); *H10K 59/1201* (2023.02)

(58) Field of Classification Search
CPC ............. H01L 27/3244; H01L 51/5262; H01L 51/5275; H01L 51/5271; G02B 19/0047; G02B 19/0066; G02B 19/0014
See application file for complete search history.

(56) References Cited

U.S. PATENT DOCUMENTS

| | | |
|---|---|---|
| 10,734,452 B1 | 8/2020 | Kim et al. |
| 11,139,346 B2 | 10/2021 | Kim et al. |
| 2021/0013453 A1* | 1/2021 | Matsuda ............. H01L 51/5275 |
| 2021/0200382 A1* | 7/2021 | Lee ...................... G02B 3/0056 |

FOREIGN PATENT DOCUMENTS

| | | | | |
|---|---|---|---|---|
| JP | 2016118675 A | * | 6/2016 | ....... H01L 27/14627 |
| KR | 1020190135778 A | | 12/2019 | |
| KR | 20200014054 A | * | 2/2020 | ........... H01L 27/322 |
| KR | 1020200014054 A | | 2/2020 | |
| KR | 1020200080611 A | | 7/2020 | |

* cited by examiner

*Primary Examiner* — Yuzhen Shen
(74) *Attorney, Agent, or Firm* — Cantor Colburn LLP

(57) ABSTRACT

A display apparatus includes a pixel electrode, a pixel-defining layer covering edges of the pixel electrode, where an opening is defined through the pixel-defining layer to expose a central portion of the pixel electrode, and a light-condensing layer disposed over the pixel electrode to correspond to the opening. A first first slope angle of a first first side surface of the light-condensing layer with respect to a lower surface of the light-condensing layer is different from a second first slope angle of a second first side surface of the light-condensing layer with respect to the lower surface.

14 Claims, 13 Drawing Sheets

DISPLAY APPARATUS INCLUDING LIGHT-CONDENSING LAYER ON SENSOR ELECTRODE LAYER AND METHOD OF MANUFACTURING THE SAME

This application claims priority to Korean Patent Application No. 10-2021-0131971, filed on Oct. 5, 2021, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus, and more particularly, to a display apparatus with uniform brightness increase in a display area, and a method of manufacturing the display apparatus.

2. Description of the Related Art

Generally, a display apparatus includes display elements to display images. The display apparatus may be utilized in various forms, for example, may be used in various electronic apparatuses such as smartphones, digital cameras, laptop computers, navigation apparatuses, or smart televisions. A display apparatus used in various electronic apparatuses may be desired to have an increased image-displaying efficiency for reduced power consumption.

SUMMARY

A conventional display apparatus may have high power consumption to increase brightness of images displayed.

One or more embodiments include a display apparatus that may achieve a uniform brightness increase in a display area, and a method of manufacturing the display apparatus.

According to one or more embodiments, a display apparatus includes a pixel electrode, a pixel-defining layer covering edges of the pixel electrode, where an opening is defined through the pixel-defining layer to expose a central portion of the pixel electrode, and a light-condensing layer disposed over the pixel electrode to correspond to the opening, where a first first slope angle of a first first side surface of the light-condensing layer with respect to a lower surface of the light-condensing layer is different from a second first slope angle of a second first side surface of the light-condensing layer with respect to the lower surface of the light-condensing layer, and the second first side surface is opposite to the first first side surface.

In an embodiment, the light-condensing layer may have a flat upper surface.

In an embodiment, each of the first first slope angle and the second first slope angle may be an acute angle.

In an embodiment, the first first slope angle may be in a first angle range, and the second first slope angle may be in a second angle range different from the first angle range.

In an embodiment, the first angle range may be greater than or equal to about 70°, and the second angle range may be less than about 70°.

In an embodiment, the display apparatus may further include an additional layer covering the light-condensing layer and having a refractive index less than a refractive index of the light-condensing layer.

In an embodiment, the display apparatus may further include a polarizing plate disposed on the additional layer, where the additional layer may be a pressure-sensitive adhesive layer.

In an embodiment, the pixel electrode may be disposed over a substrate, a third first slope angle of a third first side surface of the light-condensing layer with respect to the lower surface of the light-condensing layer may be different from a fourth first slope angle of a fourth first side surface of the light-condensing layer with respect to the lower surface of the light-condensing layer, the first first side surface may be opposite to the second first side surface in a first direction, and fourth first side surface may be a opposite to third first side surface in a second direction parallel to the substrate and crossing the first direction.

In an embodiment, each of the third first slope angle and the fourth first slope angle may be an acute angle.

In an embodiment, the third first slope angle may be in a third angle range, and the fourth first slope angle may be in a fourth angle range different from the third angle range.

In an embodiment, the third angle range may be less than about 70° and the fourth angle range may be greater than or equal to about 70°.

In an embodiment, each of the third first slope angle and the fourth first slope angle may be different from the first first slope angle and the second first slope angle.

According to one or more embodiments, a display apparatus includes a first pixel electrode and a second pixel electrode apart from each other in a first direction, a pixel-defining layer covering edges of each of the first pixel electrode and the second pixel electrode, where a first opening is defined through the pixel-defining layer to expose a central portion of the first pixel electrode, and a second opening is defined through the pixel-defining layer to expose a central portion of the second pixel electrode, a first light-condensing layer disposed over the first pixel electrode to correspond to the first opening, where a first first slope angle of a first first side surface of the first light-condensing layer with respect to a lower surface of the first light-condensing layer is different from a second first slope angle of a second first side surface of the first light-condensing layer with respect to the lower surface of the first light-condensing layer, and the second first side surface is opposite to the first first side surface in the first direction, and a second light-condensing layer disposed over the second pixel electrode to correspond to the second opening, wherein a first second slope angle with respect to a lower surface of the second light-condensing layer of a first second side surface of the second light-condensing layer in a direction to the second first side surface is different from a second second slope angle with respect to the lower surface of the second light-condensing layer of a second second side surface of the second light-condensing layer, and the second second side surface is opposite to the first second side surface in the first direction.

In an embodiment, each of the first light-condensing layer and the second light-condensing layer may have a flat upper surface.

In an embodiment, each of the first first slope angle, the second first slope angle, the first second slope angle, and the second second slope angle may be an acute angle.

In an embodiment, each of the first first slope angle and the second second slope angle may be in a first angle range, and each of the first second slope angle and the second first slope angle may be in a second angle range different from the first angle range.

In an embodiment, the first angle range may be greater than or equal to about 70°, and the second angle range may be less than about 70°.

In an embodiment, the display apparatus may further include an additional layer covering the first light-condensing layer and the second light-condensing layer and having a refractive index less than a refractive index of the first light-condensing layer and the second light-condensing layer.

In an embodiment, the display apparatus may further include a polarizing plate disposed on the additional layer, where the additional layer may be a pressure-sensitive adhesive layer.

According to one or more embodiments, a method of manufacturing a display apparatus includes forming a pixel electrode on a substrate, forming a pixel-defining layer covering edges of the pixel electrode, where an opening is formed through the pixel-defining layer to expose a central portion of the pixel electrode, forming an insulating layer including a photoresist component over the pixel-defining layer, and forming a light-condensing layer by patterning the insulating layer by using a half-tone mask or a slit-mask, where the light-condensing layer is disposed over the pixel electrode to correspond to the opening of the pixel-defining layer, and a first first slope angle of a first first side surface of the light-condensing layer with respect to a lower surface of the light-condensing layer is different from a second first slope angle of a second first side surface of the light-condensing layer with respect to the lower surface of the light-condensing layer, where the second first side surface is opposite to the first first side surface.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
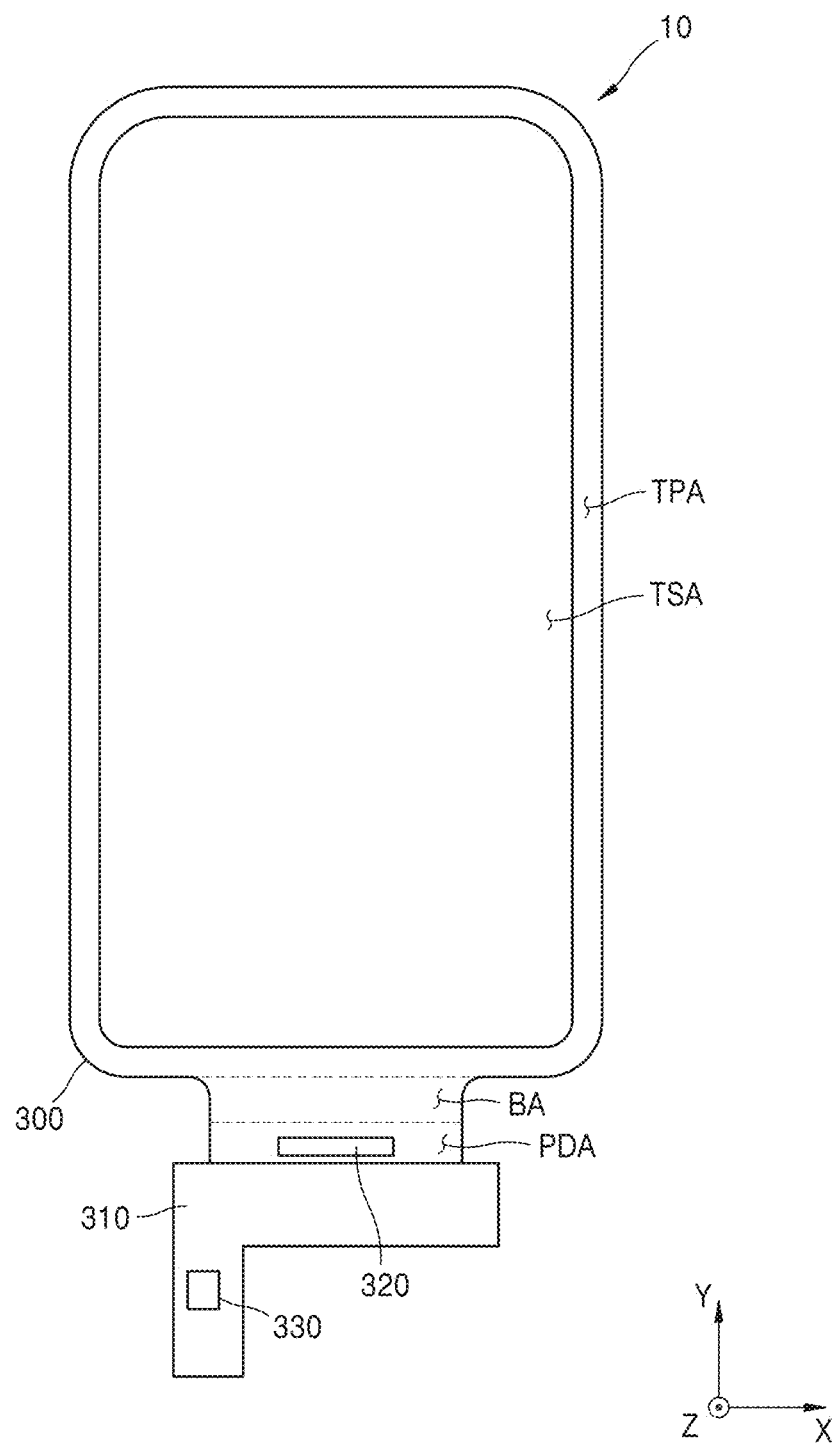
FIG. 1 is a plan view of a portion of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be understood that, when a layer, region, or component is referred to as being "on" another layer, region, or component, it can be directly or indirectly on the other layer, region, or component. That is, for example, intervening layers, regions, or components may be present. Sizes of elements in the drawings may be exaggerated or reduced for convenience of explanation. For example, since sizes and thicknesses of elements in the drawings are arbitrarily illustrated for convenience of explanation, the disclosure is not limited thereto.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Herein, X-axis, Y-axis and Z-axis are not limited to three axes of the rectangular coordinate system, and may be interpreted in a broader sense. For example, the X-axis, the Y-axis, and the Z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings. Like reference numerals refer to like elements throughout, and any repetitive detailed description thereof may be omitted or simplified.

Figure 2:
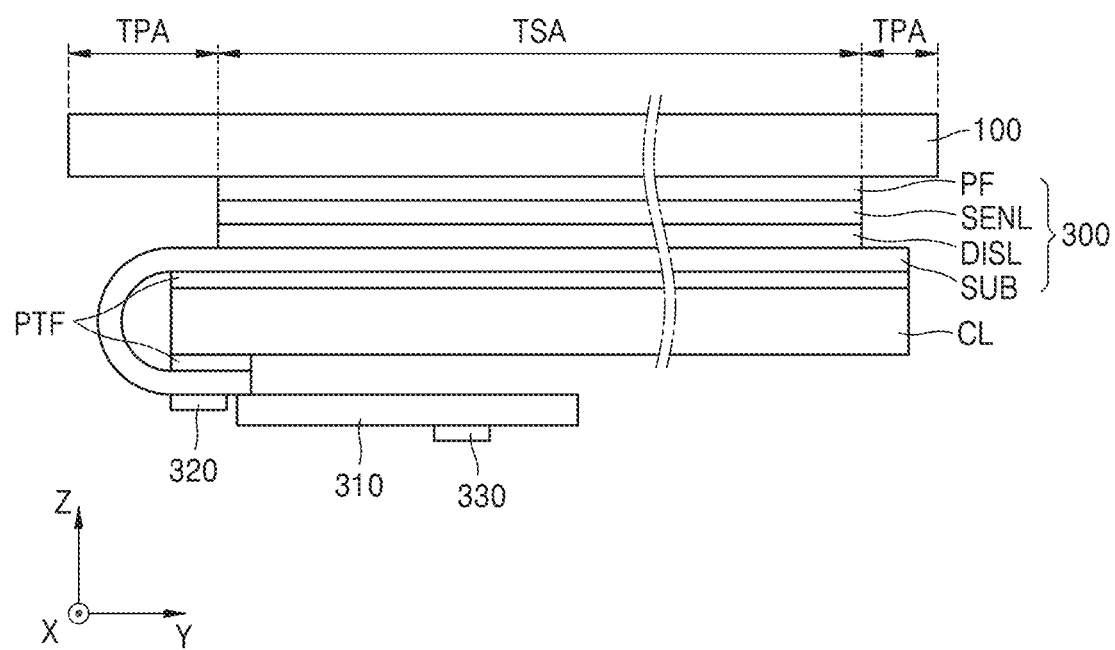
FIG. 2 is a side view of a portion of a display apparatus according to an embodiment.

FIG. 1 is a plan view of a portion of a display apparatus 10 according to an embodiment, and FIG. 2 is a side view of a portion of the display apparatus 10 of FIG. 1. In an embodiment, as shown in FIGS. 1 and 2, a substrate SUB is flexible and thus has a shape in which a display panel 300 is bent in a bent area BA. For convenience of illustration and description, FIG. 1 shows a display apparatus 10 in a state in which the display panel 300 is not bent.

Referring to FIGS. 1 and 2, an embodiment of the display apparatus 10 may include an apparatus for displaying moving images or still images and may be used as a display screen of various products including televisions, notebook computers, monitors, advertisement boards, Internet of things ("IoT") device as well as portable electronic apparatuses including mobile phones, smart phones, tablet personal computers ("PC"), mobile communication terminals, electronic organizers, electronic books, portable multimedia players ("PMP"), navigations, and ultra mobile personal computers ("UMPC"). In an embodiment, the display apparatus 10 may be used in wearable devices including smartwatches, watchphones, glasses-type displays, and head-mounted displays ("HMD"). In an embodiment, the display apparatus 10 may be used as instrument panels for automobiles, center fascias for automobiles, or center information displays ("CID") arranged on a dashboard, room mirror displays that replace side mirrors of automobiles, and displays arranged on the backside of front seats as an entertainment for back seats of automobiles.

For convenience of description, FIGS. 1 and 2 show an embodiment where the display apparatus 10 is a smartphone. In such an embodiment, the display apparatus 10 may include a cover window 100, the display panel 300, a display circuit board 310, a display driver 320, a sensor driver 330, a patterned protection film PTF, and a cushion layer CL. In such an embodiment, the display apparatus 10 may further include a bracket, a main circuit board, a battery, a lower cover, and the like that are not shown.

Hereinafter, an "upper portion" denotes a direction, that is, +Z-axis direction in which the cover window 100 is arranged with respect to the display panel 300, and a "lower portion" denotes a −Z-axis direction, which is an opposite direction thereof with respect to the display panel 300. In addition, "left" and "right" denote directions when the display panel 300 is viewed in a direction perpendicular to the display panel 300. For example, "left" denotes a −X-axis direction, and "right" denotes a +X-axis direction.

The display apparatus 10 may approximately have a rectangular shape when viewed in a direction perpendicular to the surface of the display apparatus 10 as shown in FIG. 1. In an embodiment, for example, as shown in FIG. 1, the display apparatus 10 may has a rectangular shape as a whole having short sides and long sides, where the short sides extend in a first direction (an X-axis direction) and the long sides extend in a second direction (a Y-axis direction). An edge where the short side in the first direction meets the long side in the second direction may have a round shape having a preset curvature, or have a right-angled shape. The planar shape of the display apparatus 10 is not limited to a rectangle and may have other polygons, circular shapes, or elliptical shapes.

In an embodiment, as shown in FIG. 2, the cover window 100 may be disposed over the display panel 300 to cover the upper surface of the display panel 300. The cover window 100 may protect the upper surface of the display panel 300.

The display panel 300 may be arranged or disposed under the cover window 100. The display panel 300 may overlap a transmission portion of the cover window 100. The display panel 300 may include the substrate SUB and display elements disposed over the substrate SUB. In an embodiment, as shown in FIG. 2, the display panel 300 includes the substrate SUB, a display layer DISL, a sensor electrode layer SENL, and a polarizing film PF.

The display panel 300 displays (outputs) information processed by the display apparatus 10. In an embodiment, for example, the display panel 300 may display execution screen information of an application driven in the display apparatus 10, or user interface ("UI") and graphic user interface ("GUI") information corresponding to the execution screen information. The display panel 300 may include the display layer DISL and the sensor electrode layer SENL, where the display layer DISL displays images, and the sensor electrode layer SENL senses a user's touch input. Accordingly, the display panel 300 may serve as one of input units, and simultaneously, serve as one of output units, and the input units are configured to provide an input interface between the display apparatus 10 and a user, and the output units are configured to provide an output interface between the display apparatus 10 and a user.

The substrate SUB of the display panel 300 may include an insulating material such as glass, quartz, a polymer resin, or the like. The substrate SUB may be a rigid substrate or a flexible substrate that is bendable, foldable, and rollable. In an embodiment, as shown in FIG. 2, the substrate SUB is flexible, and thus, has a shape in which the display panel 300 is bent in the bent area BA (see FIG. 1). In an embodiment, as shown in FIG. 2, only the substrate SUB is bent, but the embodiment is not limited thereto. Alternatively, at least a portion of the display layer DISL and at least a portion of the sensor electrode layer SENL may be in the bent area BA (see FIG. 1) and a pad area. In such an embodiment, at least a portion of the display layer DISL and at least a portion of the sensor electrode layer SENL may be bent in the bent area BA.

The substrate SUB includes a display area and a peripheral area outside the display area. The display elements are arranged in the display area of the substrate SUB. In an embodiment, the display layer DISL of FIG. 2 may be a layer including the display elements disposed over the substrate SUB. In such an embodiment, the display layer DISL may include a thin-film transistor layer, a display element layer, and an encapsulation layer, where the thin-film transistor layer includes thin-film transistors, the display element layer includes the display elements, and the encapsulation layer encapsulates the display element layer.

The peripheral area of the substrate SUB may be a region configured not to display images. The peripheral area may surround the display area. The peripheral area may be a region from the edge of the display area to the edge of the display panel 300. Not only pixels but scan lines, data lines, and power lines each connected to the pixels may be arranged in the display area. A scan driver, fan-out wirings, and the like may be arranged in the peripheral area, where the scan driver is configured to apply scan signals to the scan lines, and the fan-out wirings connect the data lines to the display driver 320.

The display elements may include, for example, light-emitting elements. In an embodiment, the display panel 300 may be an organic light-emitting display panel that uses organic light-emitting diodes each including an organic emission layer, a micro light-emitting diode display panel that uses micro light-emitting diodes, a quantum-dot light-emitting display panel that uses quantum-dot light-emitting diodes each including a quantum-dot emission layer, or an inorganic light-emitting display panel that uses inorganic light-emitting diodes, each including an inorganic semiconductor.

The sensor electrode layer SENL may include a sensor area TSA and a sensor peripheral area TPA as shown in FIG. 1. The sensor area TSA in which sensor electrodes are arranged may be a region configured to sense a user's touch input. The sensor peripheral area TPA may be a region in which the sensor electrodes are not arranged and may have a shape surrounding the sensor area TSA. The sensor peripheral area TPA may be a region from the edge of the sensor area TSA to the edge of the display panel 300. The sensor electrodes, connectors, and conductive patterns may be arranged in the sensor area TSA. Sensor wirings may be arranged in the sensor peripheral area TPA, and the sensor wirings may be connected to the sensor electrodes.

In an embodiment, as described above, the substrate SUB of the display panel 300 includes the display area and the peripheral area outside the display area. In such an embodiment, the sensor area TSA may overlap the display area, and the sensor peripheral area TPA may overlap the peripheral area. In such an embodiment, the peripheral area outside the display area may be a wider region including the sensor peripheral area TPA.

The sensor electrode layer SENL may sense a user's touch input by using at least one of various touch methods including a resistance method, a capacitance method, and the like. In an embodiment, for example, where the sensor electrode layer SENL senses a user's touch input by using a capacitance method, the sensor driver 330 may apply driving signals to driving electrodes of sensor electrodes and sense voltages charged in a mutual capacitance between the driving electrodes and sensing electrodes through the sensing electrodes of the sensor electrodes, thereby determining whether a user touches or not.

A user's touch may include a contact touch and a proximity touch. A contact touch denotes that an object such as a user's finger or a pen directly contacts the cover window 100 disposed over the sensor electrode layer SENL. A proximity touch denotes that, like hovering, an object such as a user's finger or a pen is located close over the cover window 100 but located apart from the cover window 100. The sensor driver 330 is configured to transfer sensor data corresponding to sensed voltages to a main processor. The main processor may calculate a touch coordinate where a touch input occurs by analyzing the sensor data.

The polarizing film PF may be disposed on the sensor electrode layer SENL. The polarizing film PF may include a linear polarizing plate and a retarding film such as a λ/4 plate (a quarter wave plate). The retarding film may be disposed on the sensor electrode layer SENL, and the linear polarizing plate may be disposed on the retarding film.

In an embodiment, the display panel 300 may be a rigid display panel that has rigidity and thus is not easily bent, or a flexible display panel that is flexible and thus is easily bent, folded, or rolled. In an embodiment, for example, the display panel 300 may be a foldable display panel that is foldable, a curved display panel in which at least a partial display surface is curved, a bended display panel in which a region except a display surface is bent, a rollable display panel that is rollable, or a stretchable display panel that is stretchable.

In an embodiment, the display panel 300 may be a transparent display panel. In such an embodiment, because the display panel 300 has a transparent characteristic, a user may see an object or a background below the display panel 300 from the upper surface of the display panel 300. Alternatively, the display panel 300 may be a reflective display panel that may reflect an object or a background behind the display panel 300.

In an embodiment, as shown in FIG. 1, the display panel 300 includes the bent area BA on one side (−Y-axis direction), such that the display panel 300 may be bent in the bent area BA as shown in FIG. 2. That is, for convenience of description, FIG. 1 shows the display panel 300 that is not bent. Because the display panel 300 is bent as described above, a pad area PDA is arranged below (a −Z-axis direction) the other portions of the display panel 300.

In an embodiment, as shown in FIG. 1, the bent area BA and the pad area PDA may protrude in a direction (the −Y-axis direction) opposite the second direction from the sensor peripheral area TPA on one side of the display panel 300. FIGS. 1 and 2 show an embodiment where the lengths of the bent area BA and the pad area PDA in the first direction (the X-axis direction) are less than the length of the sensor area TSA in the first direction (the X-axis direction), but the embodiment is not limited thereto.

The display panel 300 may be bent in the bent area BA as described above. Accordingly, the pad area PDA may overlap the sensor area TSA in a thickness direction (a Z-axis direction) of the display panel 300. The display driver 320 and the display circuit board 310 may be arranged in the pad area PDA.

The display driver 320 may receive control signals and power voltages, generate signals and voltages for driving the display panel 300, and output the signals and voltage. The display driver 320 may include an integrated circuit ("IC").

The display circuit board 310 may be electrically connected to the display panel 300. The display circuit board 310 may a flexible printed circuit board ("FPCB") that is bendable or a rigid printed circuit board ("PCB") that is rigid and thus not easily bendable. In an embodiment, the display circuit board 310 may be a composite printed circuit board including both a rigid PCB and an FPCB.

The sensor driver 330 may be arranged on the display circuit board 310. The sensor driver 330 may include an integrated circuit. The sensor driver 330 may be attached to the display circuit board 310. The sensor driver 330 may be electrically connected to the sensor electrodes of the sensor electrode layer SENL of the display panel 300 through the display circuit board 310.

A power supply unit and the like may be additionally arranged on the display circuit board 310, and the power supply unit may be configured to supply driving voltages for driving the pixels of the display panel 300, the scan driver, and the display driver 320. Alternatively, the power supply unit may be integrated with the display driver 320. In such an embodiment, the display driver 320 and the power supply unit may be implemented as a single integrated circuit.

The display circuit board 310 may be electrically connected to a main circuit board (not shown). The main circuit board may include, for example, a main processor including an integrated circuit, a camera apparatus, a wireless communication unit, an input unit, an output unit, an interface unit, a memory, and/or a power supply unit, and the like.

The patterned protection film PTF may be attached to the backside (or a lower surface) of the substrate SUB. That is, the patterned protection film PTF may be attached to the backside of the substrate SUB except the bent area BA of the substrate SUB. The patterned protection film PTF may include a first part and a second part, where the first part may correspond to a part including the central portion of the substrate SUB, and the second part may be apart from the first part and correspond to an edge portion on one side of the substrate SUB. The cushion layer CL may be arranged between the first part and the second part of the patterned protection film PTF.

The cushion layer CL may include a buffering member that absorbs external impacts and prevents the display panel 300 from being destroyed. The buffering member may have a single-layered structure or a multi-layered structure. In an embodiment, for example, the buffering member may include a polymer resin such as polyurethane, polycarbonate, polypropylene, and polyethylene, or an elastic material such as sponge that is foam-formed from rubber, a urethane-based material, or an acryl-based material.

Figure 3:
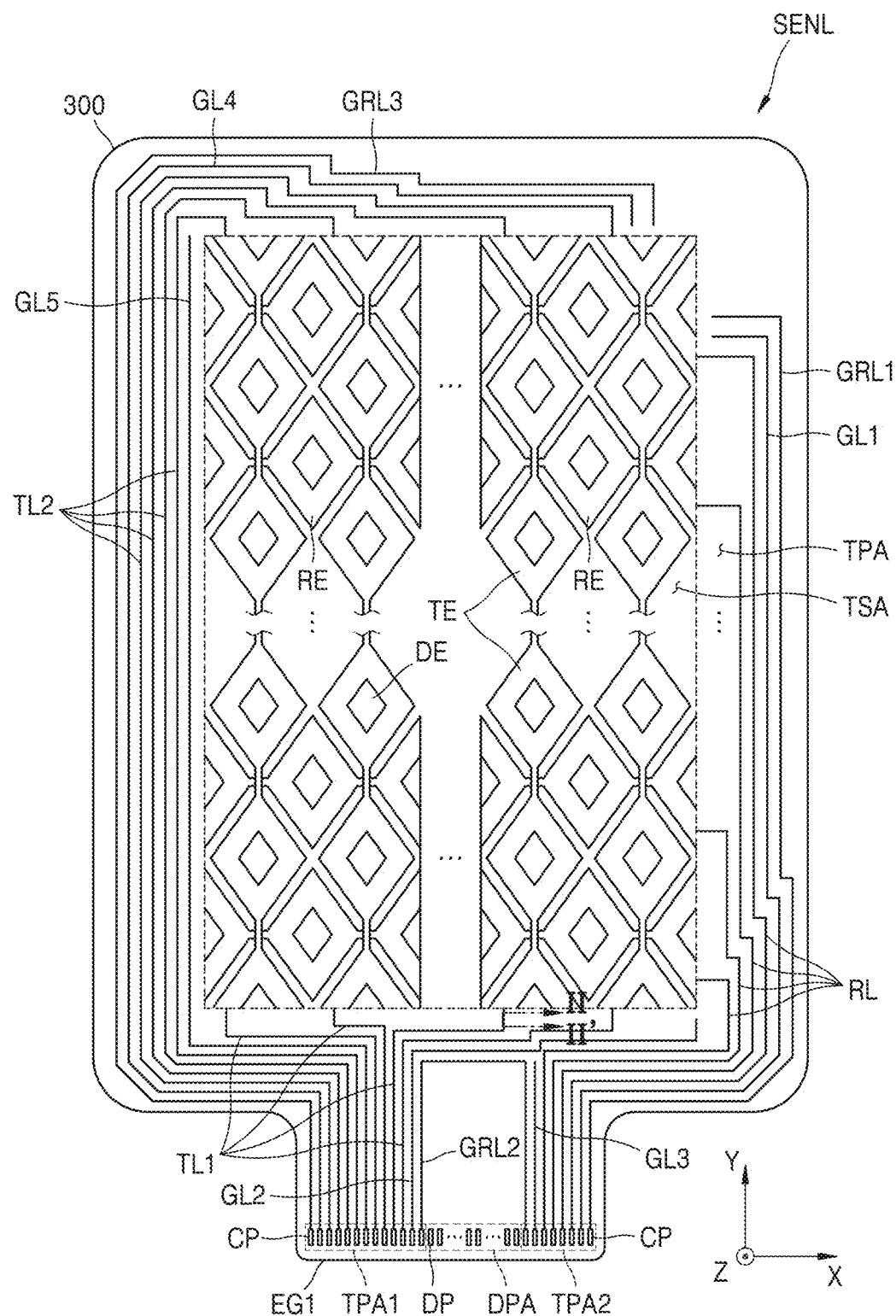
FIG. 3 is a plan view of a portion of the display apparatus of FIG. 1.

FIG. 3 is a plan view of the sensor electrode layer SENL, which is a portion of the display apparatus 10 of FIG. 1. Though FIG. 3 shows an embodiment where the sensor electrode layer SENL is flat, a portion of the sensor electrode layer SENL may be bent in the bent area BA as described with reference to FIG. 2.

In an embodiment, as shown in FIG. 3, the sensor electrode layer SENL includes two kinds of electrodes, for example, driving electrodes TE and sensing electrodes RE. Hereinafter, an embodiment where the sensor electrode layer SENL is driven in a mutual capacitance method of two layers will be mainly described with reference to FIG. 3, in which driving signals are applied to the driving electrodes TE, and then, voltages charged in mutual capacitances are sensed by the sensing electrodes RE. For convenience of description and illustration, FIG. 3 shows only the driving electrodes TE, the sensing electrodes RE, dummy patterns DE, sensor lines TL1, TL2, and RL, sensor pad areas TPA1 and TPA2, guard lines GL1, GL2, GL3, GL4, and GL5, and ground lines GRL1, GRL2, and GRL3.

In an embodiment, conductive pads CP may be arranged on one side (−X-axis direction) of the first sensor pad area TPA1, and another side (a +X-axis direction) of the second sensor pad area TPA2. The conductive pad CP may be electrically connected to the display circuit board 310 such that conductive patterns for an antenna on the substrate SUB are electrically connected to the display circuit board 310. A display pad DP may be also arranged between the sensor pad areas TPA1 and TPA2 in a display pad area DPA defined close to an edge EG1. The display driver 320 may be electrically connected to the display circuit board 310 through the display pad DP.

Referring to FIG. 3, the sensor electrode layer SENL includes the sensor area TSA and the sensor peripheral area TPA, where the sensor area TSA may be configured to sense a user's touch, and the sensor peripheral area TPA may be arranged around the sensor area TSA. As described above, the substrate SUB of the display panel 300 includes the display area and the peripheral area outside the display area. In such an embodiment, the sensor area TSA may overlap the display area, and the sensor peripheral area TPA may overlap the peripheral area. In such an embodiment, the peripheral area outside the display area may be a wider region including the sensor peripheral area TPA.

The sensor electrode layer SENL may include the first sensor electrodes and the second sensor electrodes. Hereinafter, an embodiment where the first sensor electrode is a driving electrode TE, and the second sensor electrode is a sensing electrode RE will be described in detail. Though FIG. 3 shows an embodiment where the driving electrodes TE, the sensing electrodes RE, and the dummy patterns DE each have rhombus shapes in a plan view, the embodiment is not limited thereto.

The sensing electrodes RE may be arranged in the first direction (the X-axis direction) and electrically connected to each other. The driving electrodes TE may be arranged in the second direction (the Y-axis direction) crossing the first direction (the X-axis direction) and electrically connected to each other. The driving electrodes TE may be electrically separated from the sensing electrodes RE. The driving electrodes TE may be apart from the sensing electrodes RE. For the sensing electrodes RE to be electrically separated from the driving electrodes TE at intersection regions thereof, the driving electrodes TE adjacent to each other in the second direction (the Y-axis direction) may be connected to each other through a first connector BE1 (see FIG. 4), and the sensing electrodes RE adjacent to each other in the first direction (the X-axis direction) may be connected to each other through a second connector BE2 (see FIG. 4).

The dummy patterns DE may be electrically separated from the driving electrodes TE and the sensing electrodes RE. The driving electrodes TE, the sensing electrodes RE, and the dummy patterns DE may be apart from one another. The dummy patterns DE may each be surrounded by the driving electrodes TE or the sensing electrodes RE. The dummy patterns DE may each be electrically floated.

In an embodiment, due to the dummy patterns DE, a parasitic capacitance between a first opposite electrode 1713 (see FIG. 7) of a display element described below and the driving electrode TE, or a parasitic capacitance between the first opposite electrode 1713 and the sensing electrode RE may be reduced. In such an embodiment where the parasitic capacitance is reduced, a charging speed at which a mutual capacitance between the driving electrode TE and the sensing electrode RE is charged may be effectively increased. However, due to existence of the dummy patterns DE, the areas of the driving electrodes TE and the sensing electrodes RE are reduced, and thus, a mutual capacitance between the driving electrode TE and the sensing electrode RE may be reduced. As a result, a voltage charging the mutual capacitance may be easily influenced by noises. Accordingly, the areas of the dummy patterns DE may be desired to be appropriately set by taking into account a parasitic capacitance and a mutual capacitance.

The sensor lines TL1, TL2, and RL may be arranged in the sensor peripheral area TPA. The sensor lines TL1, TL2, and RL may include sensing lines RL, first driving lines TL1, and second driving lines TL2, where the sensing lines RL may be connected to the sensing electrodes RE, and the first driving lines TL1 and the second driving lines TL2 may be connected to the driving electrodes TE.

The sensing electrodes RE arranged on one side of the sensor area TSA may be connected to the sensing lines RL. In an embodiment, for example, as shown in FIG. 3, the sensing electrode RE arranged on the right end among the sensing electrodes RE electrically connected to each other in the first direction (the X-axis direction) may be connected to the sensing line RL. The sensing lines RL may be connected to second sensor pads inside the second sensor pad area TPA2. Accordingly, the sensor driver 330 may be electrically connected to the sensing electrodes RE.

The driving electrodes TE arranged on one side of the sensor area TSA may be connected to the first driving lines TL1, and the driving electrodes TE arranged on another side of the sensor area TSA may be connected to the second driving lines TL2. In an embodiment, for example, as shown in FIG. 3, the driving electrode TE arranged on the lower end among the driving electrodes TE electrically connected to each other in the second direction (the Y-axis direction) may be connected to the first driving line TL1, and the driving electrode TE arranged on the upper end may be connected to the second driving line TL2. The second driving lines TL2 may be connected to the driving electrodes TE in the upper side of the sensor area TSA through the left outer side of the sensor area TSA. The first driving lines TL1 and the second driving lines TL2 may be connected to first sensor pads inside the first sensor pad area TPA1. Accordingly, the sensor driver 330 may be electrically connected to the driving electrodes TE.

A first guard line GL1 may be arranged outside the sensing line RL arranged at the outermost portion among the sensing lines RL. In addition, a first ground line GRL1 may be arranged outside the first guard line GL1. In an embodiment, as shown in FIG. 3, the first guard line GL1 may be arranged on the right of the sensing line RL arranged on the right end among the sensing lines RL, and the first ground line GRL1 may be arranged on the right of the first guard line GL1.

A second guard line GL2 may be arranged between the sensing line RL arranged on the innermost side among the sensing lines RL and the first driving line TL1 arranged on the right end among the first driving lines TL1. In an embodiment, as shown in FIG. 3, the sensing line RL arranged on the innermost side among the sensing lines RL may be the sensing line RL arranged on the left end among the sensing lines RL. In addition, the second guard line GL2 may be arranged between the first driving line TL1 arranged on the right end among the first driving lines TL1 and a second ground line GRL2.

A third guard line GL3 may be arranged between the sensing line RL arranged on the innermost side among the sensing lines RL and the second ground line GRL2. The second ground line GRL2 may be connected to the first sensor pad arranged on the rightmost side among the first sensor pads inside the first sensor pad area TPA1, and the second sensor pad arranged on the leftmost side among the second sensor pads inside the second sensor pad area TPA2.

A fourth guard line GL4 may be arranged outside the second driving line TL2 arranged on the outermost portion among the second driving lines TL2. In an embodiment, as shown in FIG. 3, the fourth guard line GL4 may be arranged on the left of the second driving line TL2 arranged on the left end among the second driving lines TL2. The third ground line GRL3 may be arranged outside the fourth guard line GL4. In an embodiment, as shown in FIG. 3, the fourth guard line GL4 may be arranged on the left side and the upper side of the second driving line TL2 arranged on the outermost portion among the second driving lines TL2. The third ground line GRL3 may be arranged on the left side and the upper side of the fourth guard line GL4.

A fifth guard line GL5 may be arranged inside the second driving line TL2 arranged on the innermost side among the second driving lines TL2. In an embodiment, as shown in FIG. 3, the fifth guard line GL5 may be arranged between the second driving line TL2 arranged on the right end among the second driving lines TL2, and the sensing electrode RE.

A grounding voltage may be applied to the first ground line GRL1, the second ground line GRL2, and the third ground line GRL3. In addition, a grounding voltage may be applied to the first guard line GL1, the second guard line GL2, the third guard line GL3, the fourth guard line GL4, and the fifth guard line GL5.

As shown in FIG. 3, the driving electrodes TE adjacent to each other in the second direction (the Y-axis direction) are electrically connected to each other, and the driving electrodes TE adjacent to each other in the first direction (the X-axis direction) are electrically insulated from each other. In addition, the sensing electrodes RE adjacent to each other in the first direction (the X-axis direction) are electrically connected to each other, and the sensing electrodes RE adjacent to each other in the second direction (the Y-axis direction) are electrically insulated from each other. Accordingly, mutual capacitances may be formed at intersection points of the driving electrodes TE and the sensing electrodes RE.

In an embodiment, as shown in FIG. 3, the first guard line GL1 is arranged between the sensing line RL on the outermost portion and the first ground line GRL1, such that the sensing line RL on the outermost portion may be prevented from being influenced by a voltage change of the first ground line GRL1. The second guard line GL2 is arranged between the sensing line RL on the innermost side and the first driving line TL1 on the outermost portion. Accordingly, the sensing line RL on the innermost side and the first driving line TL1 on the outermost portion (right end) may be prevented from being influenced by a voltage change. In such an embodiment, the third guard line GL3 is arranged between the sensing line RL on the innermost side and the second ground line GRL2, such that the sensing line RL on the innermost side may be prevented from being influenced by a voltage change of the second ground line GRL2. In such an embodiment, the fourth guard line GL4 is arranged between the second driving line TL2 on the outermost portion and the third ground line GRL3, such that the second driving line TL2 may be prevented from being influenced by a voltage change of the third ground line GRL3. In such an embodiment, the fifth guard line GL5 is arranged between the second driving line TL2 on the innermost side and the sensor electrodes (for example, the driving electrode TE and sensing electrode RE), such that the second driving line TL2 may be prevented from being influenced by the sensor electrodes.

Figure 4:
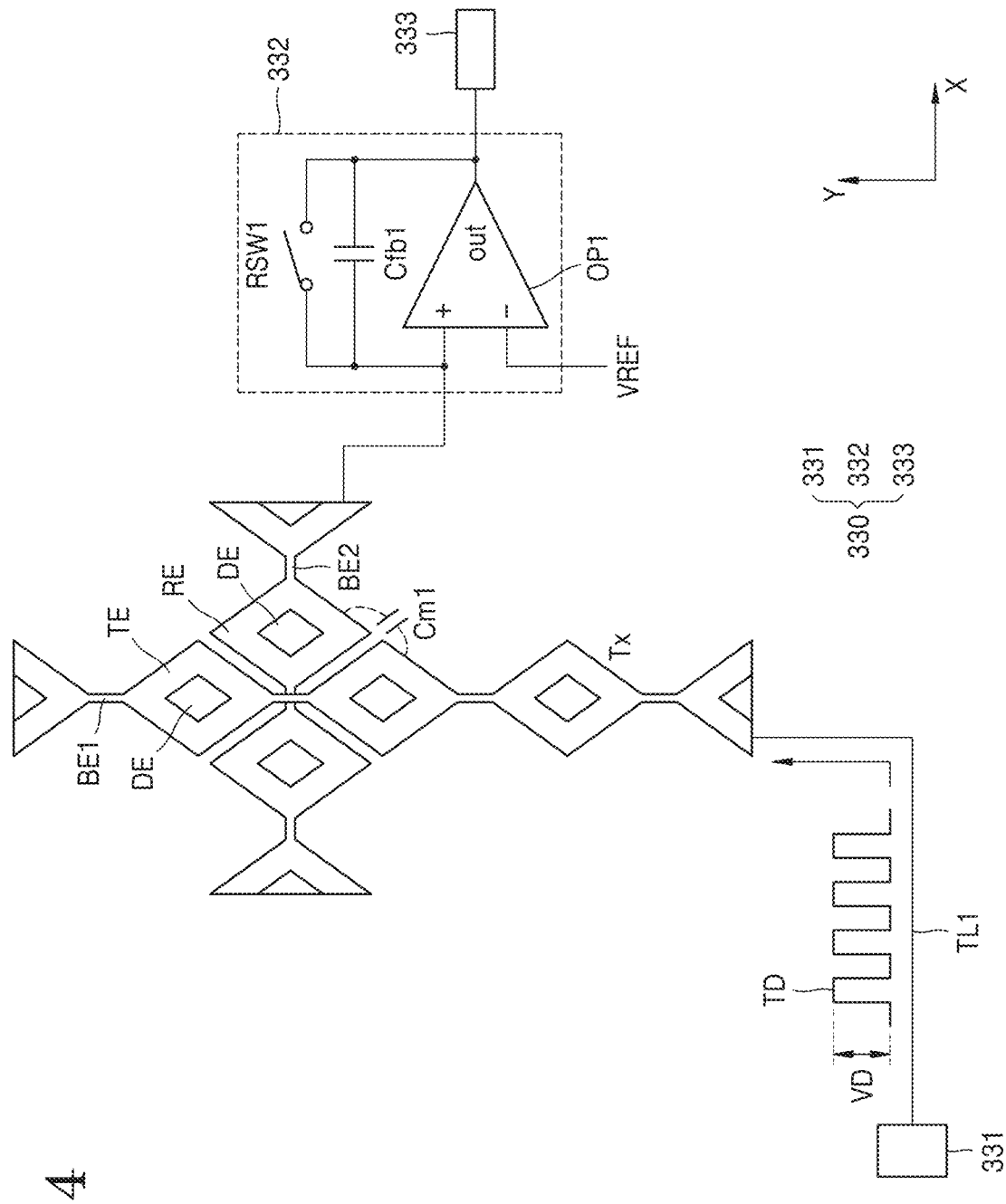
FIG. 4 is a conceptual view of a portion of FIG. 3.

FIG. 4 shows a portion of FIG. 3 and is a view showing the sensor driver connected to the sensor electrodes. For convenience of description, FIG. 4 shows only the driving electrodes TE and the sensing electrodes RE, where the driving electrodes TE are arranged on one column and electrically connected to each other in the second direction (the Y-axis direction), and the sensing electrodes RE are arranged on one row and electrically connected to each other in the first direction (the X-axis direction).

In an embodiment, as shown in FIG. 4, the sensor driver 330 may include a driving signal output unit 331, a first sensor detector 332, and a first analog-to-digital converter 333.

The driving signal output unit 331 may output a touch driving signal TD to the driving electrodes TE through the first driving line TL1, and output a touch driving signal TD to the driving electrodes TE through the second driving line TL2. A touch driving signal TD may include a plurality of pulses with a predetermined voltage VD. The driving signal output unit 331 may output touch driving signals TD to the first driving line TL1 and the second driving line TL2 according to a preset order. In an embodiment, for example, the driving signal output unit 331 may sequentially output touch driving signals TD to the driving electrodes TE on the left of the sensor area TSA of FIG. 3 to the driving electrodes TE on the right of the sensor area TSA.

The first sensor detector 332 detects a voltage charged in a first mutual capacitance Cm1 through the sensing line RL electrically connected to the sensing electrodes RE. In an embodiment, as shown in FIG. 4, the first mutual capacitance Cm1 may be formed between the driving electrode TE and the sensing electrode RE.

The first sensor detector 332 may include a first operational amplifier OP1, a first feedback capacitor Cfb1, and a first reset switch RSW1. The first operational amplifier OP1 may include a first input terminal (−), a second input terminal (+), and an output terminal (out). The first input terminal (−) of the first operational amplifier OP1 may receive an initialization voltage VREF, the second input terminal (+) may be connected to the sensing line RL, and the output terminal (out) of the first operational amplifier OP1 may be connected to a first storage capacitor. The first storage capacitor may be connected between the output terminal (out) of the first operational amplifier OP1 and a ground to store an output voltage Vout1 of the first operational amplifier OP1. The first feedback capacitor Cfb1 and the first reset switch RSW1 may be connected in parallel between the second input terminal (+) and the output terminal (out) of the first operational amplifier OP1. The first reset switch RSW1 is configured to control connection between two opposite ends of the first feedback capacitor Cfb1. In a case where the first reset switch RSW1 is turned on and the two opposite ends of the first feedback capacitor Cfb1 are connected to each other, the first feedback capacitor Cfb1 may be reset.

An output voltage Vout1 of the first operational amplifier OP1 may be defined as $Vout1=(Cm1 \times Vt1)/Cfb1$. Here, "Cfb1" denotes a capacitance of the first feedback capacitor Cfb1, and "Vt1" denotes a voltage charged at the first mutual capacitance Cm1.

The first analog-to-digital converter 333 may convert an output voltage Vout1 stored in the first storage capacitor to first digital data and output the first digital data.

In an embodiment, as shown in FIG. 4, the sensor electrode layer SENL may determine whether a user touches by sensing voltages charged in the first mutual capacitances Cm1.

Figure 5:
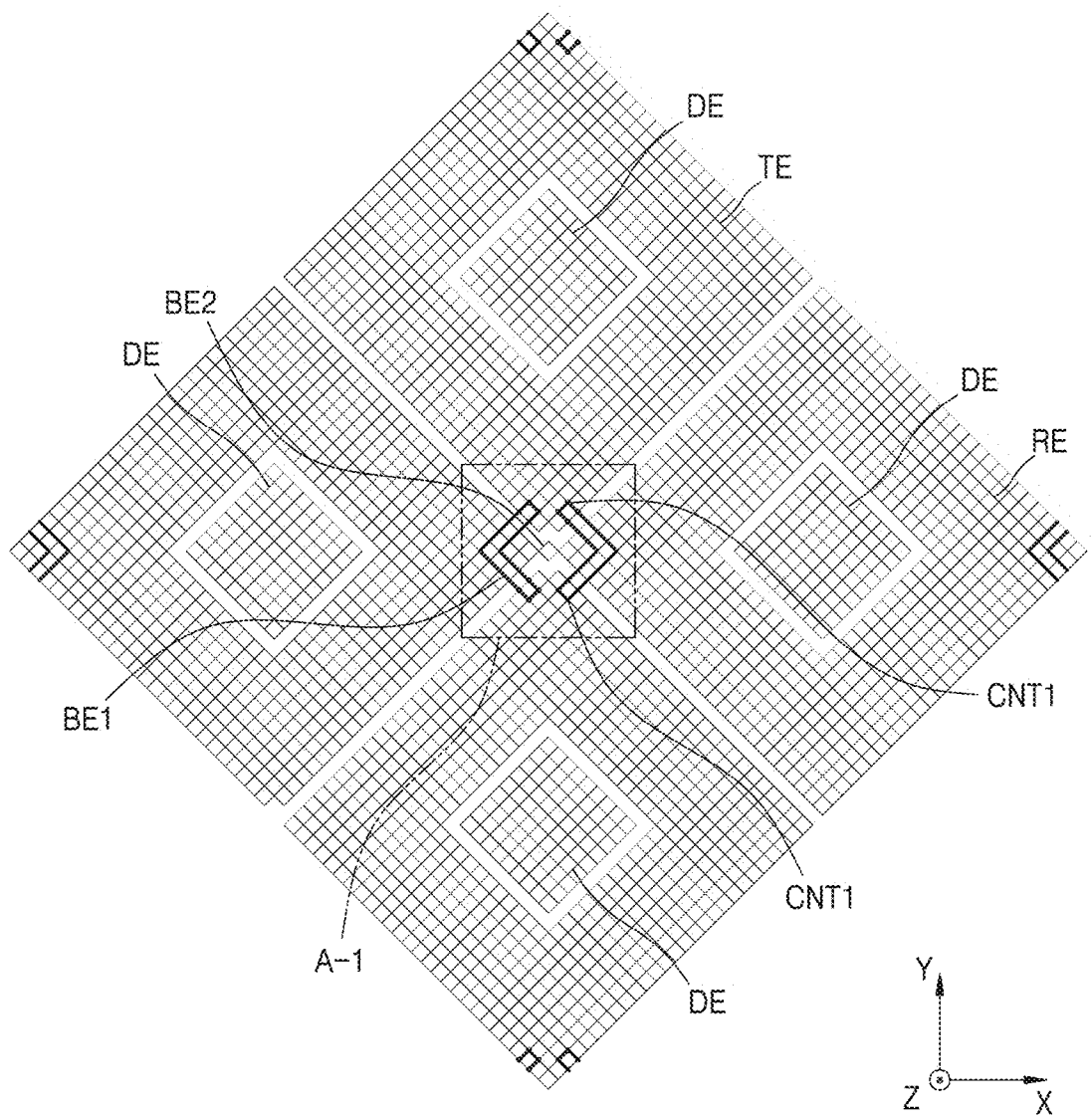
FIG. 5 is a detailed enlarged plan view of a portion of FIG. 4.

FIG. 5 is a detailed enlarged plan view of a sensor area TSA, which is a portion of FIG. 4. For convenience of illustration and description, FIG. 5 shows only two sensing electrodes RE adjacent to each other in the first direction (the X-axis direction) and two driving electrodes TE adjacent to each other in the second direction (the Y-axis direction).

Referring to FIG. 5, in an embodiment, the driving electrodes TE, the sensing electrodes RE, and the dummy patterns DE may each have a quadrangular shape in a plan view when viewed in a direction perpendicular to the substrate SUB, but the embodiment is not limited thereto. In an embodiment, the driving electrodes TE, the sensing electrodes RE, the dummy patterns DE, the first connectors BE1, and the second connectors BE2 may have a mesh structure in a plan view when viewed in a direction perpendicular to the substrate SUB.

The sensing electrodes RE may be arranged in the first direction (the X-axis direction) and electrically connected to each other. The driving electrodes TE may be arranged in the second direction (the Y-axis direction) and electrically connected to each other. The dummy pattern DE may be surrounded by the driving electrode TE or the sensing electrode RE. The driving electrodes TE, the sensing electrodes RE, and the dummy patterns DE may be electrically separated or insulated from one another. The driving electrodes TE, the sensing electrodes RE, and the dummy patterns DE may be spaced apart from one another.

In an embodiment where the sensing electrodes RE are electrically separated from the driving electrodes TE at intersection regions thereof, the driving electrodes TE adjacent to each other in the second direction (the Y-axis direction) may be connected to each other through a first connector BE1, and the sensing electrodes RE adjacent to each other in the first direction (the X-axis direction) may be connected to each other through a second connector BE2. The first connector BE1 may be formed or disposed in a layer different from that of the driving electrodes TE, and connected to the driving electrodes TE through first contact holes CNT1. In an embodiment, for example, the first connector BE1 may be disposed over a second buffer layer BF2 (see FIG. 7), and the driving electrodes TE may be disposed over a sensor insulating layer TINS (see FIG. 7).

The first connector BE1 may have a shape bent at least one time. FIG. 5 shows an embodiment where the first connectors BE1 each have a bent shape such as a clamp shape ("<" or ">"), but the shape of the first connectors BE1 is not limited thereto. In an embodiment, where the driving electrodes TE adjacent to each other in the second direction (the Y-axis direction) are connected to each other by the plurality of first connectors BE1, even when one of the first connectors BE1 is disconnected, the driving electrodes TE adjacent to each other in the second direction (the Y-axis direction) may be stably connected to each other. FIG. 5 shows an embodiment where the driving electrodes TE adjacent to each other are connected to each other by the first connector BE1, but the number of first connectors BE1 is not limited thereto.

The second connector BE2 may be formed or disposed on a same layer as the sensing electrodes RE and may have a shape extending from the sensing electrodes RE. In an embodiment, the sensing electrodes RE and the second connectors BE2 may be integrally formed with each other as a single unitary body. In such an embodiment, the sensing electrodes RE and the second connector BE2 may be simultaneously formed using a same material during a same manufacturing process. The sensing electrodes RE and the second connector BE2 may be disposed over the sensor insulating layer TINS (see FIG. 7).

Figure 6:
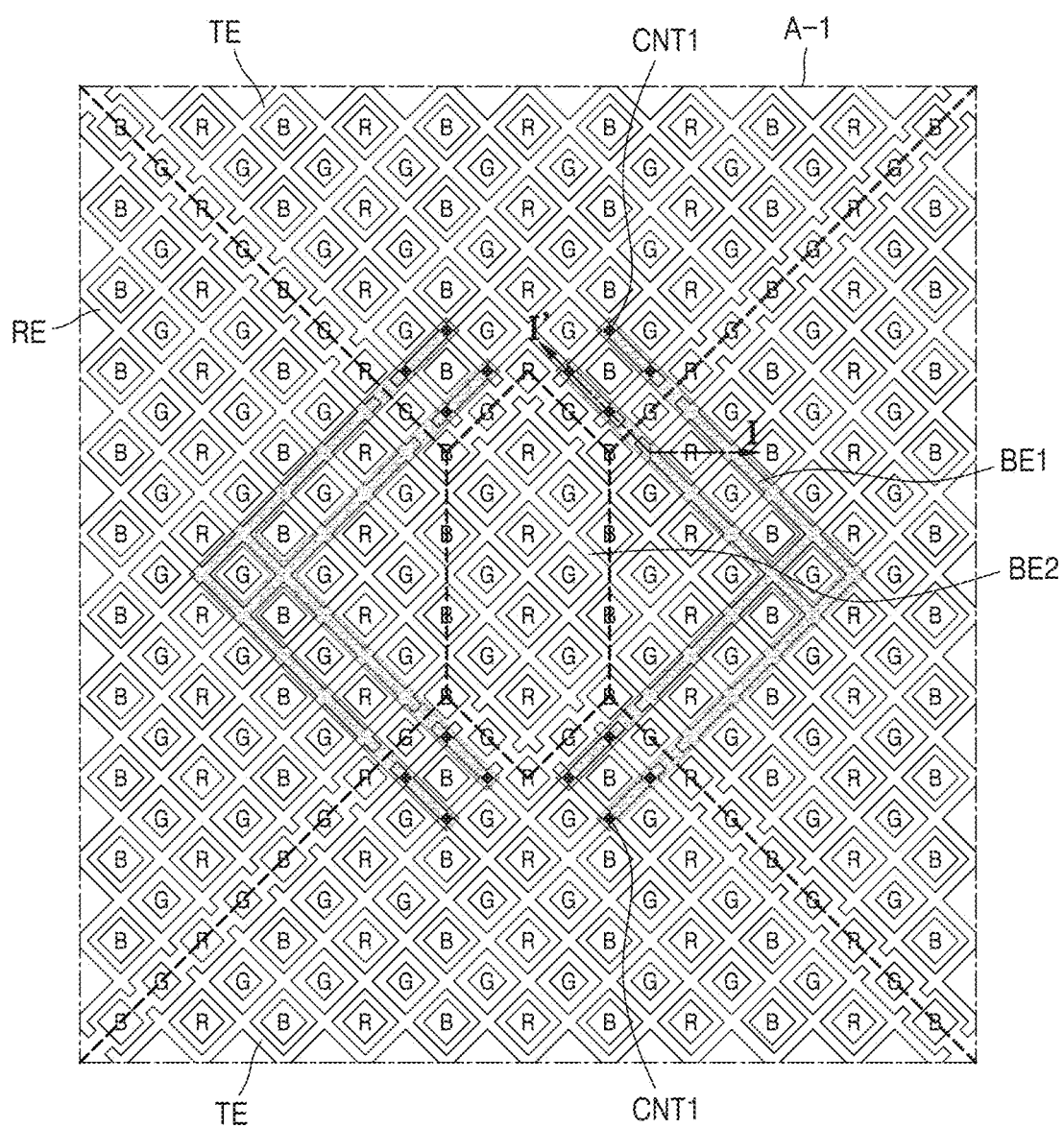
FIG. 6 is a detailed enlarged plan view of a portion of FIG. 5.
Figure 7:
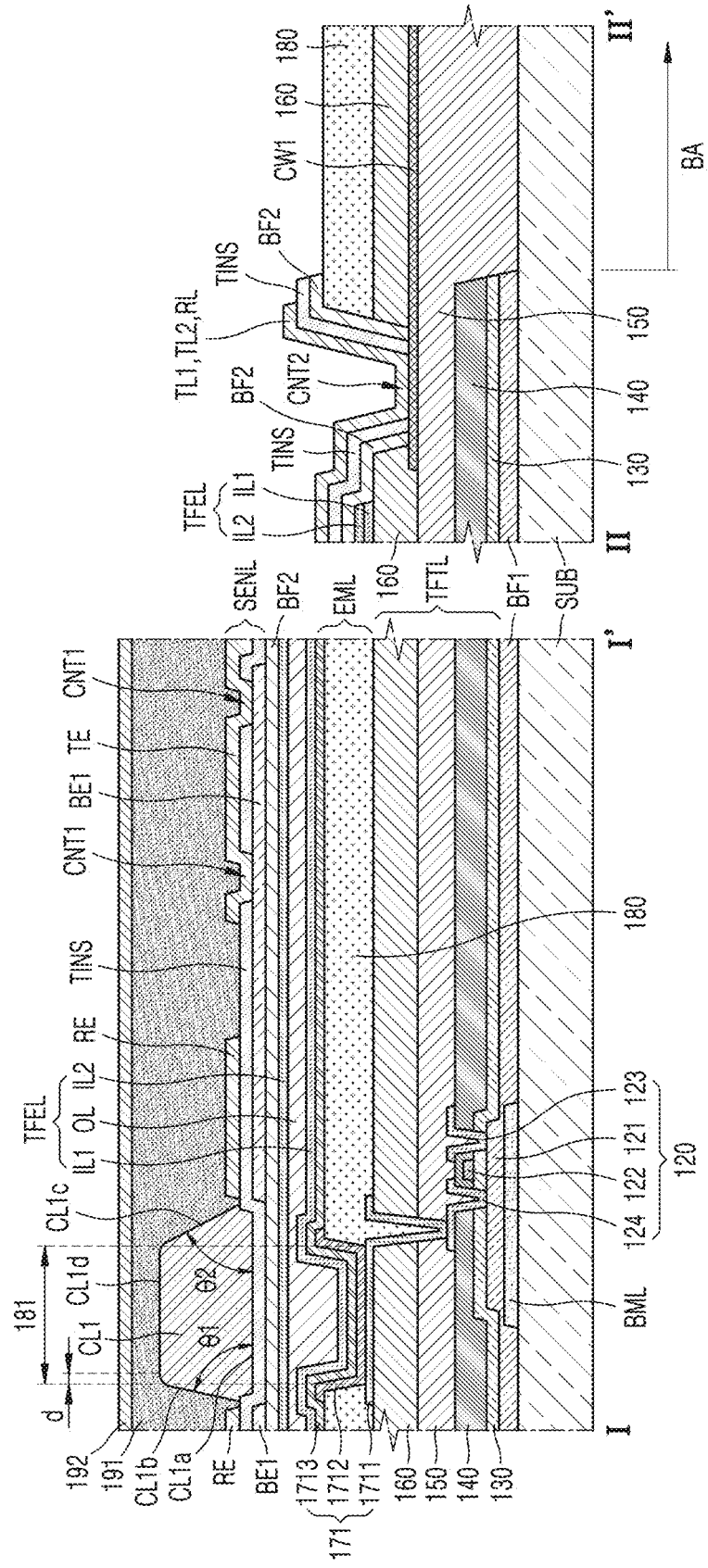
FIG. 7 is a cross-sectional view of the display apparatus, taken along line I-I' of FIG. 6 and line II-II' of FIG. 3.

As shown in FIG. 7, which is a cross-sectional view of the display apparatus 10, taken along line I-I' of FIG. 6 and a cross-sectional view of the display apparatus 10, taken along line II-II' of FIG. 3 described below, the first connectors BE1 connecting the driving electrodes TE adjacent to each other in the second direction (the Y-axis direction) may be disposed over the second buffer layer BF2, and the driving electrodes TE, the sensing electrodes RE, the dummy patterns DE and the second connectors BE2 may be disposed over the sensor insulating layer TINS. Accordingly, the driving electrodes TE may be electrically separated from the sensing electrodes RE in the intersection regions thereof, and the sensing electrodes RE may be electrically connected to each other in the first direction (the X-axis direction), and the driving electrodes TE may be electrically connected to each other in the second direction (the Y-axis direction).

FIG. 6 is a detailed enlarged plan view of the sensor electrodes and the connectors of FIG. 5, which is an enlarged view of a region A-1 of FIG. 5.

As shown in FIG. 6, in an embodiment, the driving electrodes TE, the sensing electrodes RE, the first connectors BE1, and the second connectors BE2 may have a mesh structure in a plan view when viewed in a direction perpendicular to the substrate SUB. The dummy patterns DE may also have a mesh structure in a plan view when viewed in a direction perpendicular to the substrate SUB. In an embodiment where the sensor electrode layer SENL including the driving electrodes TE and the sensing electrodes RE is arranged directly on the encapsulation layer TFEL as shown in FIG. 7, a distance between the first opposite electrode 1713 (see FIG. 7) of a display element and the driving electrode TE of the sensor electrode layer SENL, or a distance between the first opposite electrode 1713 and the sensing electrode RE of the sensor electrode layer SENL becomes short. In such an embodiment, a parasitic capacitance between the first opposite electrode 1713 of the display element and the driving electrode TE of the sensor electrode layer SENL, or between the first opposite electrode 1713 of the display element and the sensing electrode RE of the sensor electrode layer SENL may increase. In such an embodiment, as the parasitic capacitance is proportional to an overlapping area between the first opposite electrode 1713 of the display element and the driving electrode TE of the sensor electrode layer SENL, an overlapping area between the first opposite electrode 1713 of the display element and the sensing electrode RE of the sensor electrode layer SENL may be decreased. Accordingly, in such an embodiment, the driving electrodes TE and the sensing electrodes RE have a mesh structure in a plan view when viewed in a direction perpendicular to the substrate SUB such that the parasitic capacitance may be reduced.

Because the driving electrodes TE, the sensing electrodes RE, the dummy patterns DE and the second connectors BE2 are disposed on a same layer, the driving electrodes TE, the sensing electrodes RE, the dummy patterns DE, and the second connectors BE2 may be apart from one another. In such an embodiment, gaps may be defined between the driving electrode TE and the sensing electrode RE, between the driving electrode TE and the second connector BE2, between the driving electrode TE and the dummy pattern DE, and between the sensing electrode RE and the dummy pattern DE. For convenience of description, in FIG. 6, a boundary between the driving electrode TE and the sensing electrode RE, a boundary between the driving electrode TE and the second connector BE2, and a boundary between the sensing electrode RE and the second connector BE2 are shown in dashed lines.

The first connector BE1 may be connected to the driving electrodes TE through a first contact hole CNT1. One end of the first connector BE1 may be connected to one of the driving electrodes TE adjacent to each other in the second direction (the Y-axis direction) through the first contact hole CNT1. Another end of the first connector BE1 may be connected to another of the driving electrodes TE adjacent to each other in the second direction (the Y-axis direction) through the first contact hole CNT1. The first connector BE1 may overlap the driving electrodes TE and the sensing electrode RE. Alternatively, the first connector BE1 may overlap the second connector BE2 instead of the sensing electrode RE. Alternatively, the first connector BE1 may overlap both the sensing electrode RE and the second connector BE2. Because the first connector BE1 is disposed on a layer different from a layer on which the driving electrodes TE, the sensing electrodes RE, and the second connector BE2 are disposed, even though the first connector BE1 overlaps the sensing electrode RE and/or the second connector BE2, the first connector BE1 may not be short-circuited with the sensing electrode RE and/or the second connector BE2.

The second connector BE2 may be arranged between the sensing electrodes RE. The second connector BE2 may be disposed on a same layer as the sensing electrodes RE and may extend from each of the sensing electrodes RE. Accordingly, the second connector BE2 may be connected to the sensing electrodes RE without a separate contact hole. In an embodiment, the sensing electrode RE and the second connector BE2 may be integrally formed with each other as a single unitary body.

Sub-pixels R, G, and B may include a first sub-pixel R, a second sub-pixel G, and a third sub-pixel B, where the first sub-pixel R emits light of a first color, the second sub-pixel G emits light of a second color, and the third sub-pixel B emits light of a third color. FIG. 6 shows an embodiment where the first sub-pixel R is a first sub-pixel, the second sub-pixel G is a second sub-pixel, and the third sub-pixel B is a third sub-pixel, but the embodiment is not limited thereto. FIG. 6 shows an embodiment where the first sub-pixel R, the second sub-pixel G, and the third sub-pixel B each have a quadrangular shape in a plan view when viewed in a direction perpendicular to the substrate SUB, but the embodiment is not limited thereto. In an alternative embodiment, for example, the first sub-pixel R, the second sub-pixel G, and the third sub-pixel B may each have other polygonal shapes other than quadrangular shapes, circular shapes, or elliptical shapes in a plan view. FIG. 6 shows an embodiment where the size of the third sub-pixel B is largest, and the size of the second sub-pixel G is smallest, but the embodiment is not limited thereto.

A pixel P denotes sub-pixels in one group that may express grayscales. FIG. 6 shows an embodiment where a pixel P includes one first sub-pixel R, two second sub-pixels G, and one third sub-pixel B, but the embodiment is not limited thereto. In an alternative embodiment, for example, the pixel P may include one first sub-pixel R, one second sub-pixel G, and one third sub-pixel B.

The driving electrodes TE, the sensing electrodes RE, the dummy patterns DE, the first connectors BE1, and the second connectors BE2 may each have a mesh structure in a plan view when viewed in a direction perpendicular to the substrate SUB. Accordingly, the sub-pixels R, G, and B may not overlap the driving electrodes TE, the sensing electrodes RE, the dummy patterns DE, the first connectors BE1, and/or the second connectors BE2. As a result, light from the sub-pixels R, G, and B may be prevented from being screened by the driving electrodes TE, the sensing electrodes RE, the dummy patterns DE, the first connectors BE1, and/or the second connectors BE2, and thus, the brightness of the light may be prevented from being reduced.

FIG. 7 is a cross-sectional view of the display apparatus 10, taken along a line I-I' of FIG. 6 and a line II-II' of FIG. 3. As shown in FIG. 7, the display layer DISL may be disposed on the substrate SUB, and the display layer DISL includes a first buffer layer BF1, a thin-film transistor layer TFTL, an emission element layer EML, and an encapsulation layer TFEL.

The first buffer layer BF1 may be disposed on one surface of the substrate SUB. The first buffer layer BF1 may protect thin-film transistors 120 and the emission element layer EML from moisture penetrating through the substrate SUB. The first buffer layer BF1 may have a single-layered structure or a multi-layered structure. In an embodiment, for example, the first buffer layer BF1 may has a multi-layered structure in which one or more inorganic layers, each including at least one selected from a silicon nitride layer, a silicon oxynitride layer, a silicon oxide layer, a titanium oxide layer, and an aluminum oxide layer are alternately stacked. Alternatively, the first buffer layer BF1 may be omitted.

The thin-film transistor layer TFTL on the first buffer layer BF1 may include the thin-film transistors 120, a gate insulating layer 130, an interlayer insulating layer 140, a first planarization layer 150, and a second planarization layer 160.

The thin-film transistor 120 may include an active layer 121, a gate electrode 122, a source electrode 123, and a drain electrode 124. FIG. 7 shows an embodiment where the thin-film transistor 120 is a top-gate thin-film transistor in which the gate electrode 122 is arranged over the active layer 121, but the embodiment is not limited thereto. Alternatively, the thin-film transistor 120 may be a bottom-gate thin-film transistor in which the gate electrode 122 is arranged below the active layer 121, or a double-gate thin-film transistor in which the gate electrode 122 are respectively arranged above and below the active layer 121.

The active layer 121 may be disposed on the first buffer layer BF1. The active layer 121 may include polycrystalline silicon, single-crystalline silicon, low-temperature polycrystalline silicon, amorphous silicon, or an oxide semiconductor. In an embodiment, for example, an oxide semiconductor may include binary compound ($AB_x$), ternary compound ($AB_xC_y$), or quaternary compound ($AB_xC_yD_z$) containing indium, zinc, gallium, tin, titanium, aluminum, hafnium (Hf), zirconium (Zr), magnesium (Mg), or the like. Alternatively, the active layer 121 may include indium-tin-zinc oxide ("ITZO") (oxide including indium, tin, and Zinc) or indium-gallium-zinc oxide ("IGZO") (oxide including indium, gallium, and Zinc). A light-blocking layer BML may be arranged under the active layer 121. The light-blocking layer BML may have a single-layered structure or a multi-layered structure, each layer therein including at least one selected from molybdenum (Mo), aluminum (Al), chrome (Cr), gold (Au), titanium (Ti), nickel (Ni), neodymium (Nd), copper (Cu), and an alloy thereof.

The gate insulating layer 130 may be disposed on the active layer 121. The gate insulating layer 130 may be an inorganic layer including silicon nitride, silicon oxynitride, silicon oxide, titanium oxide, or aluminum oxide.

The gate electrode 122 and a gate line may be disposed on the gate insulating layer 130. The gate electrode 122 may overlap the active layer 121. The gate electrode 122 and the gate line may have a single-layered structure or a multi-layered structure, each layer therein including at least one selected from molybdenum (Mo), aluminum (Al), chrome (Cr), gold (Au), titanium (Ti), nickel (Ni), neodymium (Nd), copper (Cu), and an alloy thereof.

The interlayer insulating layer 140 may be disposed on the gate electrode 122 and the gate line. The interlayer insulating layer 140 may be an inorganic layer including silicon nitride, silicon oxynitride, silicon oxide, titanium oxide, or aluminum oxide.

As shown in FIG. 7 for the region II-II of FIG. 3, the first buffer layer BF1, the gate insulating layer 130, and the interlayer insulating layer 140 including an inorganic material may be omitted in the bent area BA. In such an embodiment, cracks and the like may be effectively prevented from occurring in the bent area BA while the display panel 300 is bent. In such an embodiment, the first planarization layer 150, the second planarization layer 160, or the like in the bent area BA described below includes an organic material, such that a probability that the cracks and the like occur is very low.

The source electrode 123 and the drain electrode 124 may be disposed on the interlayer insulating layer 140. The source electrode 123 and the drain electrode 124 may each contact the active layer 121 through contact holes defined through the interlayer insulating layer 140. The source electrode 123 and the drain electrode 124 may have a single-layered structure or a multi-layered structure, each layer herein including at least one selected from molybdenum (Mo), aluminum (Al), chrome (Cr), gold (Au), titanium (Ti), nickel (Ni), neodymium (Nd), copper (Cu), and an alloy thereof.

The first planarization layer 150 may be disposed on the source electrode 123 and the drain electrode 124, the first planarization layer 150 planarizing a step difference due to the thin-film transistor 120. The first planarization layer 150 may include an insulating organic material such as an acryl resin, an epoxy resin, a phenolic resin, a polyamide resin, a polyimide resin, or the like.

The second planarization layer 160 may be disposed on the first planarization layer 150. The second planarization layer 160 may also include an insulating organic material such as an acryl resin, an epoxy resin, a phenolic resin, a polyamide resin, a polyimide resin, or the like. Various wirings including a conductive material or the like may be arranged between the first planarization layer 150 and the second planarization layer 160 when needed.

The emission element layer EML is disposed on the thin-film transistor layer TFTL. The emission element layer EML may include first display elements 171 and a pixel-defining layer 180. The first display elements 171 and the pixel-defining layer 180 may be disposed on the second planarization layer 160.

The first display elements 171 may each be an organic light-emitting element shown in FIG. 7. The organic light-emitting element may include a first pixel electrode 1711, a first intermediate layer 1712, and the first opposite electrode 1713, and the first intermediate layer 1712 may include a first emission layer.

The first pixel electrode 1711 may be disposed on the second planarization layer 160. FIG. 7 shows an embodiment where the first pixel electrode 1711 is connected to the drain electrode 124 of the thin-film transistor 120 through a contact hole defined through the first planarization layer 150 and the second planarization layer 160, but the embodiment is not limited thereto. In an alternative embodiment, for example, an intermediate conductive layer may be arranged between the first planarization layer 150 and the second planarization layer 160, the intermediate conductive layer may be connected to the drain electrode 124 of the thin-film transistor 120 through a contact hole defined through the first planarization layer 150, and the first pixel electrode 1711 may be connected to the intermediate layer through a contact hole defined through the second planarization layer 160. Alternatively, the first pixel electrode 1711 may be electrically connected to the source electrode 123 instead of the drain electrode 124.

In an embodiment where the display apparatus 10 is a top-emission display apparatus that emits light to the outside through the first opposite electrode 1713 with respect to the first intermediate layer 1712 including the first emission layer, the first pixel electrode 1711 may include a metal material having a high reflectivity such as a stack structure of aluminum and titanium (e.g., Ti/Al/Ti), a stack structure of aluminum and indium tin oxide ("ITO") (e.g., ITO/Al/ITO), a layer including an APC alloy, or a stack structure of an APC alloy and ITO (e.g., ITO/APC/ITO). Here, the APC alloy is an alloy of silver (Ag), palladium (Pd), and/or copper (Cu).

In an embodiment where the display apparatus 10 is a bottom-emission display apparatus that emits light to the outside through the first pixel electrode 1711 with respect to the first intermediate layer 1712 including the first emission layer, the first pixel electrode 1711 may include a transparent conductive material (e.g. such as transparent conductive oxide "TCO") such as ITO and indium zinc oxide ("IZO") that may transmit light, or a semi-transmissive conductive material such as magnesium (Mg), silver (Ag), or an alloy of magnesium (Mg) and silver (Ag).

The pixel-defining layer 180 may cover the edges of each first pixel electrode 1711, and a first opening 181 is defined through the pixel-defining layer 180 to expose the central portion of the first pixel electrode 1711. The pixel-defining layer 180 may include an organic material such as an acryl resin, an epoxy resin, a phenolic resin, a polyamide resin, a polyimide resin, or the like.

The first intermediate layer 1712 is disposed on the first pixel electrode 1711 and the pixel-defining layer 180, and the first intermediate layer 1712 may include the first emission layer. The first intermediate layer 1712 may include a hole transport layer or an electron transport layer besides the first emission layer. The first emission layer of the first intermediate layer 1712 may have a shape patterned to correspond to each first pixel electrode 1711 as shown in FIG. 7. A hole transport layer, an electron transport layer, or the like besides the first emission layer may be patterned to correspond to each first pixel electrode 1711, or may have a shape that is one body over other pixel electrodes as well as the first pixel electrode 1711. In an alternative embodiment, the first emission layer may also have a shape that is one body over the plurality of first pixel electrodes 1711. In such an embodiment, a color filter, a quantum-dot filter, or the like may be arranged on a light path to implement a full-color display.

The first opposite electrode 1713 is disposed over the first intermediate layer 1712 including the first emission layer. A capping layer may be disposed on the first opposite electrode 1713. In the top-emission display apparatus, the first opposite electrode 1713 may include a TCO such as ITO and IZO that may transmit light, or a semi-transmissive conductive material such as magnesium (Mg), silver (Ag), or an alloy of magnesium (Mg) and silver (Ag). In the bottom-emission display apparatus, the first opposite electrode 1713 may have a high reflectivity by including a stack structure of aluminum and titanium (Ti/Al/Ti), a stack structure of aluminum and ITO (e.g., ITO/Al/ITO), a layer including an APC alloy, or a stack structure of an APC alloy and ITO (e.g., ITO/APC/ITO). Here, the APC alloy is an alloy of silver (Ag), palladium (Pd), and/or copper (Cu).

The encapsulation layer TFEL is disposed over the emission element layer EML, for example, the first opposite electrode 1713. The encapsulation layer TFEL may prevent oxygen, moisture, or the like from penetrating to the first intermediate layer 1712 including the first emission layer and the first opposite electrode 1713. In an embodiment, for example, the encapsulation layer TFEL may include a first inorganic layer IL1, an organic layer OL, and a second inorganic layer IL2, where the first inorganic layer IL1 may be on the first opposite electrode 1713, the organic layer OL may be on the first inorganic layer IL1, and the second inorganic layer IL2 may be on the organic layer OL. The first inorganic layer IL1 and the second inorganic layer IL2 may include silicon nitride, silicon oxynitride, silicon oxide, titanium oxide, or aluminum oxide. The organic layer OL may include an acryl resin, an epoxy resin, a phenolic resin, a polyamide resin, a polyimide resin, or the like.

The encapsulation layer TFEL extends outside the display area, and the first inorganic layer IL1 may contact the second inorganic layer IL2 outside the display area. FIG. 7 shows an embodiment where a thickness of the encapsulation layer TFEL existing in a portion of a region II-II' of FIG. 3 is thinner that a thickness of the encapsulation layer TFEL in a region I-I' of FIG. 6. In such an embodiment, because there is no organic layer OL between the first inorganic layer IL1 and the second inorganic layer IL2 of the encapsulation layer TFEL in the region II-II' of FIG. 3, the first inorganic layer IL1 contacts the second inorganic layer IL2. As shown in FIG. 7 for the region II-II' of FIG. 3, the side surfaces of the ends of the first inorganic layer IL1 and the second inorganic layer IL2 may have an inclined shape not perpendicular to the upper surface of the substrate SUB.

The sensor electrode layer SENL is disposed over the encapsulation layer TFEL. As described above, the sensor electrode layer SENL may include the second buffer layer BF2, the driving electrodes TE, the sensing electrodes RE, dummy patterns DE, the first connectors BE1, the first driving lines TL1, the second driving lines TL2, the sensing lines RL, the guard lines GL1, GL2, GL3, GL4, and GL5, the ground lines GRL1, GRL2, and GRL3, and the sensor insulating layer TINS. FIG. 7 shows the second buffer layer BF2, the driving electrode TE, the sensing electrode RE, the first connector BE1, and the sensor insulating layer TINS in the region I-I' of FIG. 6, and shows the second buffer layer BF2, the first driving lines TL1, the second driving lines TL2, the sensing lines RL, and the sensor insulating layer TINS in the region II-II' of FIG. 3.

The second buffer layer BF2 may include an inorganic layer including, for example, silicon nitride, silicon oxynitride, silicon oxide, titanium oxide, or aluminum oxide.

The first connectors BE1 may be disposed on the second buffer layer BF2. The first connectors BE1 may overlap the pixel-defining layer 180 when viewed in a third direction (a Z-axis direction). The first connectors BE1 may have a stack structure of aluminum and titanium (e.g., Ti/Al/Ti), a stack structure of aluminum and ITO (e.g., ITO/Al/ITO), a layer including an APC alloy, or a stack structure of an APC alloy and ITO (e.g., ITO/APC/ITO). However, the embodiment is not limited thereto.

The sensor insulating layer TINS is disposed on the first connector BE1. The sensor insulating layer TINS may include an inorganic layer including, for example, silicon nitride, silicon oxynitride, silicon oxide, titanium oxide, or aluminum oxide. Alternatively, the sensor insulating layer TINS may include an insulating organic material such as an acryl resin, an epoxy resin, a phenolic resin, a polyamide resin, a polyimide resin, or the like.

The driving electrodes TE, the sensing electrodes RE, the dummy patterns DE, the second connectors BE2, the first driving lines TL1, the second driving lines TL2, the sensing lines RL, the guard lines GL1, GL2, GL3, GL4, and GL5, and the ground lines GRL1, GRL2, and GRL3 may be disposed over the sensor insulating layer TINS. The driving electrodes TE, the sensing electrodes RE, the dummy patterns DE, and the second connectors BE2 may overlap the pixel-defining layer 180 when viewed in the third direction (the Z-axis direction). The driving electrodes TE, the sensing electrodes RE, the dummy patterns DE, the second connectors BE2, the first driving lines TL1, the second driving lines TL2, the sensing lines RL, the guard lines GL1, GL2, GL3, GL4, and GL5, and the ground lines GRL1, GRL2, and GRL3 may have a stack structure of aluminum and titanium (e.g., Ti/Al/Ti), a stack structure of aluminum and ITO (e.g., ITO/Al/ITO), a layer including an APC alloy, or a stack structure of an APC alloy and ITO (e.g., ITO/APC/ITO). However, the embodiment is not limited thereto. The first driving lines TL1, the second driving lines TL2, and the sensing lines RL may be simultaneously formed while the driving electrodes TE and the sensing electrodes RE are formed, and may include a same materials as that of the driving electrodes TE and the sensing electrodes RE.

In an embodiment, the first contact hole CNT1 may be defined through the sensor insulating layer TINS to expose the first connectors BE1. The driving electrodes TE may be connected to the first connectors BE1 through the first contact hole CNT1.

As shown in FIG. 7, the first connectors BE1 connecting the driving electrodes TE adjacent to each other in the second direction (the Y-axis direction) may be disposed on the second buffer layer BF2. The driving electrodes TE, the sensing electrodes RE, and the second connectors BE2 may be disposed on the sensor insulating layer TINS. Accordingly, the driving electrodes TE may be electrically separated or insulated from the sensing electrodes RE in the intersection regions thereof, and the sensing electrodes RE may be electrically connected to each other in the first direction (the X-axis direction), and the driving electrodes TE may be electrically connected to each other in the second direction (the Y-axis direction).

As described above with reference to FIG. 3, the first driving lines TL1, the second driving lines TL2, and the sensing lines RL extend to the sensor peripheral area TPA and are connected to the first sensor pads inside the first sensor pad area TPA1, or the second sensor pads inside the second sensor pad area TPA2. However, the first driving lines TL1, the second driving lines TL2, and the sensing lines RL are not directly connected to the first sensor pads or the second sensor pads. In an embodiment, for example, as shown in FIG. 7, the first driving lines TL1, the second driving lines TL2, and/or the sensing lines RL may be connected to first connection wirings CW1 in the sensor peripheral area TPA, and the first connection wirings CW1 may be connected to the first sensor pads or the second sensor pads.

The first connection wiring CW1 may be arranged between the first planarization layer 150 and the second planarization layer 160. The first connection wiring CW1 may have a stack structure of aluminum and titanium (e.g., Ti/Al/Ti), a stack structure of aluminum and ITO (e.g., ITO/Al/ITO), a layer including an APC alloy, or a stack structure of an APC alloy and ITO (e.g., ITO/APC/ITO). However, the embodiment is not limited thereto. In such an embodiment, because the first connection wiring CW1 is arranged between the first planarization layer 150 and the second planarization layer 160 each including an organic material, even when the display panel 300 is bent in the bent area BA, cracks and the like may be effectively prevented from occurring in the first connection wiring CW1.

For the first driving lines TL1, the second driving lines TL2, and/or the sensing lines RL to be connected to the first connection wiring CW1, the second planarization layer 160, the second buffer layer BF2, the pixel-defining layer 180, and the sensor insulating layer TINS may have a second contact hole CNT2 corresponding to an end of the first connection wiring CW1 in a direction of the display area.

In an embodiment, because the encapsulation layer TFEL is formed after the second contact hole CNT2 is formed in the second planarization layer 160 during the manufacturing process, the encapsulation layer TFEL is formed not to cover the second contact hole CNT2 in a region set in advance by using a mask.

In an embodiment, a first light-condensing layer CL1 may be disposed on the sensor insulating layer TINS. Alternatively, a portion of the first light-condensing layer CL1 may be arranged also in the driving electrode TE and/or the sensing electrode RE. The first light-condensing layer CL1 is disposed over the first pixel electrode 1711 to correspond to the first opening 181 of the pixel-defining layer 180. In an embodiment, a first first slope angle θ1 of a first first side surface CL1$b$ of the first light-condensing layer CL1 with respect to a first lower surface CL1$a$ of the first light-condensing layer CL1 is different from a second first slope angle θ2 of a second first side surface CL1$c$ of the first light-condensing layer CL1 with respect to the first lower surface CL1$a$. In such an embodiment, the second first side surface CL1$c$ is a side surface of the first light-condensing layer CL1 in an opposite direction from the first first side surface CL1$b$. In such an embodiment, the first light-condensing layer CL1 has a flat upper surface CL1$d$.

The first light-condensing layer CL1 may increase brightness at the front of the display apparatus 10. Light emitted from the first emission layer of the first intermediate layer 1712 includes not only light progressing in a direction approximately perpendicular to the first pixel electrode 1711 but light progressing in an oblique direction. The first light-condensing layer CL1 may change a path of latter light to allow the latter light to progress in a direction approximately perpendicular to the first pixel electrode 1711, thereby increasing brightness at the front of the display apparatus 10.

In such an embodiment, the first first slope angle θ1 of and the second first slope angle θ2 may each be an acute angle. In addition, a light-condensing function of the first light-condensing layer CL1 may be increased by covering the first light-condensing layer CL1 by an additional layer 191 having a refractive index less than a refractive index of the first light-condensing layer CL1. In an embodiment, for example, the first light-condensing layer CL1 may have a refractive index of about 1.54, and the additional layer 191 may have a refractive index of about 1.47. A difference between the refractive index of the first light-condensing layer CL1 and the refractive index of the additional layer 191 may be about 0.06 or greater.

The first light-condensing layer CL1 may include an inorganic layer, for example, silicon nitride, silicon oxynitride, silicon oxide, titanium oxide, or aluminum oxide. Alternatively, the first light-condensing layer CL1 may include an insulating organic material such as an acryl resin, an epoxy resin, a phenolic resin, a polyamide resin, a polyimide resin, or the like. In an embodiment, the additional layer 191 may be, for example, a pressure sensitive adhesive ("PSA") layer. In such an embodiment, the additional layer 191 may bond a polarizing plate 192 thereon to the sensor electrode layer SENL. The polarizing plate 192 may be the polarizing film PF described above with reference to FIG. 2.

Figure 8:
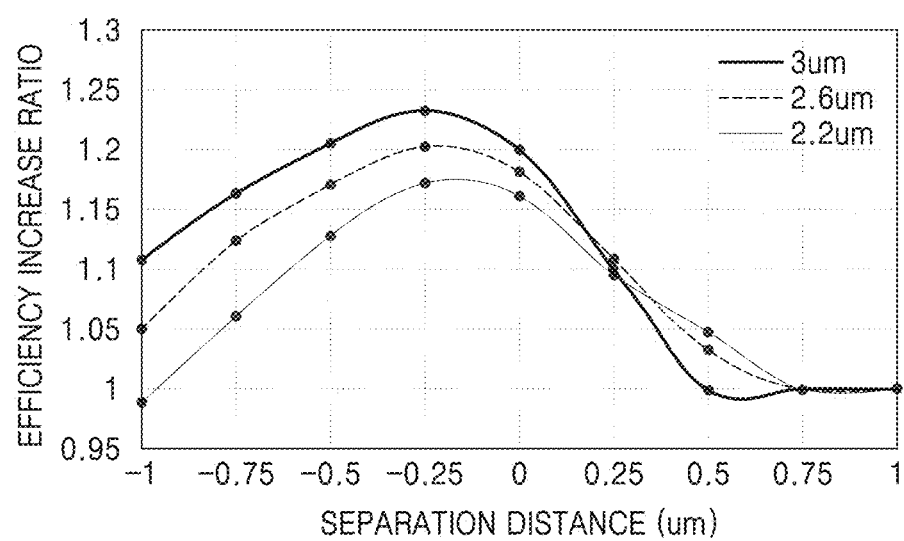
FIGS. 8 and 9 are graphs showing an efficiency increase ratio change according to an angle of the side surface of a light-condensing layer.
Figure 9:
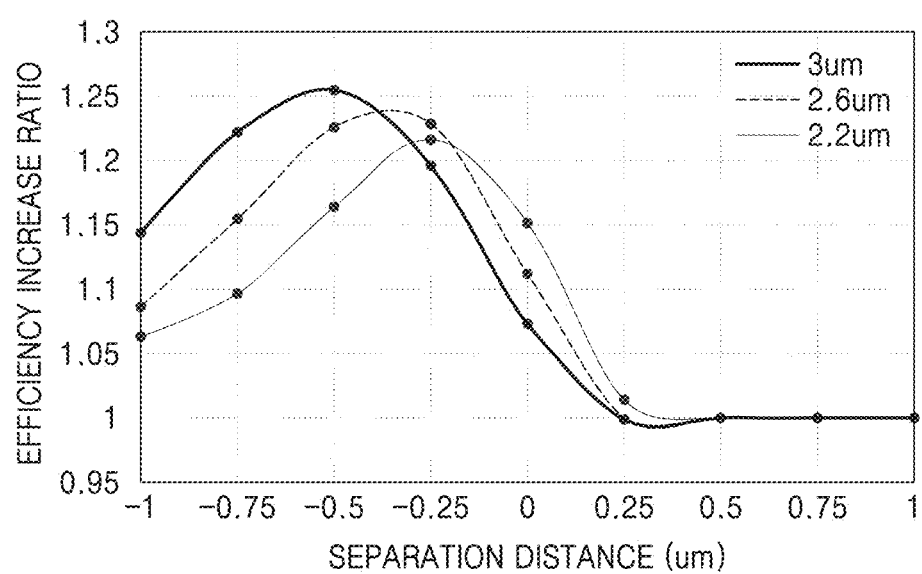

FIGS. 8 and 9 are graphs showing a light efficiency increase ratio using elements corresponding to the first light-condensing layer CL1. In an embodiment, as described above, the first first slope angle θ1 of the first first side surface CL1b with respect to the first lower surface CL1a of the first light-condensing layer CL1 is different from the second first slope angle θ2 of the second first side surface CL1c with respect to the first lower surface CL1a, and second first side surface CL1c is the opposite side surface from the first first side surface CL1b. However, FIGS. 8 and 9 are graphs in a case where slopes of two opposite side surfaces of the light-condensing layer are the same as each other. FIG. 8 is a graph in a case where an angle between the side surface and the lower surface of the light-condensing layer is about 76°, and FIG. 9 is a graph in the case where an angle between the side surface and the lower surface of the light-condensing layer is about 66°.

A horizontal axis of each of FIGS. 8 and 9 is a separation distance and denotes a distance (in a plan view) d between the end of the flat upper surface CL1d of the first light-condensing layer CL1 shown in FIG. 7 and the first opening 181 of the pixel-defining layer 180 in unit of micrometer (μm). In an embodiment, for example, the separation distance of 0 denotes that the flat upper surface CL1d of the first light-condensing layer CL1 accurately coincides with the first opening 181 of the pixel-defining layer 180 when viewed in a direction perpendicular to the substrate SUB. The separation distance in a positive number denotes that the flat upper surface CL1d of the first light-condensing layer CL1 overlaps the first opening 181 of the pixel-defining layer 180 when viewed in a direction perpendicular to the substrate SUB, and the area of the flat upper surface CL1d of the first light-condensing layer CL1 is greater than the area of the first opening 181 of the pixel-defining layer 180. The separation distance in a negative number denotes that the flat upper surface CL1d of the first light-condensing layer CL1 overlaps the first opening 181 of the pixel-defining layer 180 when viewed in a direction perpendicular to the substrate SUB, and the area of the flat upper surface CL1d of the first light-condensing layer CL1 is less than the area of the first opening 181 of the pixel-defining layer 180.

A vertical axis of each of FIGS. 8 and 9 is an efficiency increase ratio and denotes a ratio of brightness based on the brightness at the front of the display apparatus in a case where an insulating layer covering the sensor insulating layer TINS, the driving electrode TE, the sensing electrode RE, and the like is formed, and the additional layer 191 includes a PSA having a refractive index of about 1.47, where the insulating layer includes a same material as that of the first light-condensing layer CL1 having a refractive index of about 1.54, and has a same thickness as that of the first light-condensing layer CL1.

As shown in the graphs of FIGS. 8 and 9, results of the case where an angle of the side surface with respect to the lower surface of the light-condensing layer is about 76° are very different from results of the case where an angle of the side surface with respect to the lower surface of the light-condensing layer is about 66°. In an embodiment, for example, in the case where the separation distance is 0 and the thickness of the light-condensing layer is about 3 μm, when an angle of the side surface with respect to the lower surface of the light-condensing layer is about 76°, an efficiency increase ratio is about 1.20. In contrast, when an angle of the side surface with respect to the lower surface of the light-condensing layer is about 66°, an efficiency increase ratio is about 1.07. As described above, it is shown that, as a slope of the side surface with respect to the lower surface of the light-condensing layer changes, the efficiency increase ratio becomes very different. In addition, the efficiency increase ratio may change according to the change of the thickness of the light-condensing layer. However, during the process of manufacturing the display apparatus, though the thickness of the light-condensing layer may be precisely controlled while the light-condensing layer is formed, it may not be easy to very precisely control the slope of the side surface with respect to the lower surface of the light-condensing layer. Accordingly, due to a change in the slope of the side surface with respect to the lower surface of the light-condensing layer, it may not be easy to achieve a uniform condensing efficiency improvement over the entire display area.

In an embodiment of the display apparatus 10 according to the invention, as described above, the first first slope angle θ1 of the first first side surface CL1b with respect to the first lower surface CL1a of the first light-condensing layer CL1 is different from the second first slope angle θ2 of the second first side surface CL1c with respect to the first lower surface CL1a and the second first side surface CL1c is the opposite side surface from the first first side surface CL1b. When the first light-condensing layers CL1 each including the first first side surface CL1b and the second first side surface CL1c that respectively have the first first slope angle θ1 and the second first slope angle θ2 are dispersed in the sensor area TSA, which is the display area, even though the first first slope angle θ1 or the second first slope angle θ2 change slightly during the manufacturing process, a uniform condensing efficiency improvement may be achieved over the entire display area.

In such an embodiment, the first first slope angle θ1 may be in a first angle range, and the second first slope angle θ2 may be in a second angle range different from the first angle range. In such an embodiment, the first angle range and the second angle range may each be an angle range less than about 90°. The first angle range may be equal to or greater than about 70°, the first angle range may be, for example, equal to or greater than about 70° and less than about 80°, and the second angle range may be less than about 70°, the second angle range may be, for example, equal to or greater than about 50° and less than about 70°.

Figure 10:
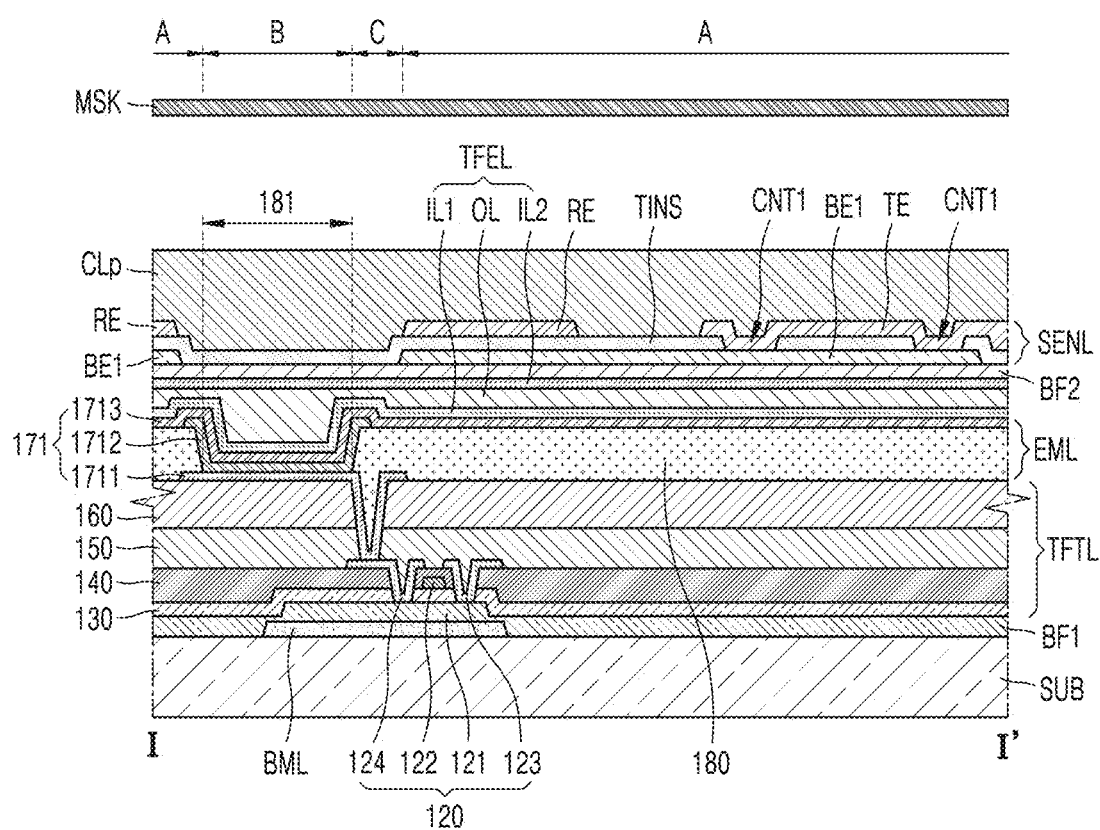
FIG. 10 is a cross-sectional view of one process of an embodiment of a method of manufacturing the display apparatus of FIG. 7.

FIG. 10 is a cross-sectional view of one process of an embodiment of a method of manufacturing the display apparatus of FIG. 7. In an embodiment of a method of manufacturing the display apparatus, as shown in FIG. 10, the first display element 171 including the first pixel electrode 1711 is formed. Subsequently, the sensor electrode layer SENL is formed. Then, a preliminary layer CLp as an insulating layer is formed, where the preliminary layer CLp includes a material of the first light-condensing layer CL1, and covers the sensor insulating layer TINS, the driving electrode TE, the sensing electrode RE, and the like. The preliminary layer CLp is exposed by using a mask MSK. The preliminary layer CLp may include a photoresist material. In an embodiment, for example, portions of the preliminary layer CLp that are not exposed may be removed afterward during a development process. In such an embodiment, a transmittance of the mask MSK may have a highest value in a region B that is a region in which the upper surface CL1d of the first light-condensing layer CL1 is to be arranged, a transmittance of the mask MSK may have an intermediate value in a region C that is a region in which the second first side surface CL1c having a relatively low slope with respect to the lower surface is to be formed, and a transmittance of the mask MSK may have a minimum value in a region A that is the other regions except for region B and region C. When the preliminary layer CLp is exposed and then developed by using a half-tone mask as the mask MSK (i.e., the preliminary layer CLp is patterned by using a half-tone mask), the first light-condensing layer CL1 may be formed as shown in FIG. 7.

Figure 11:
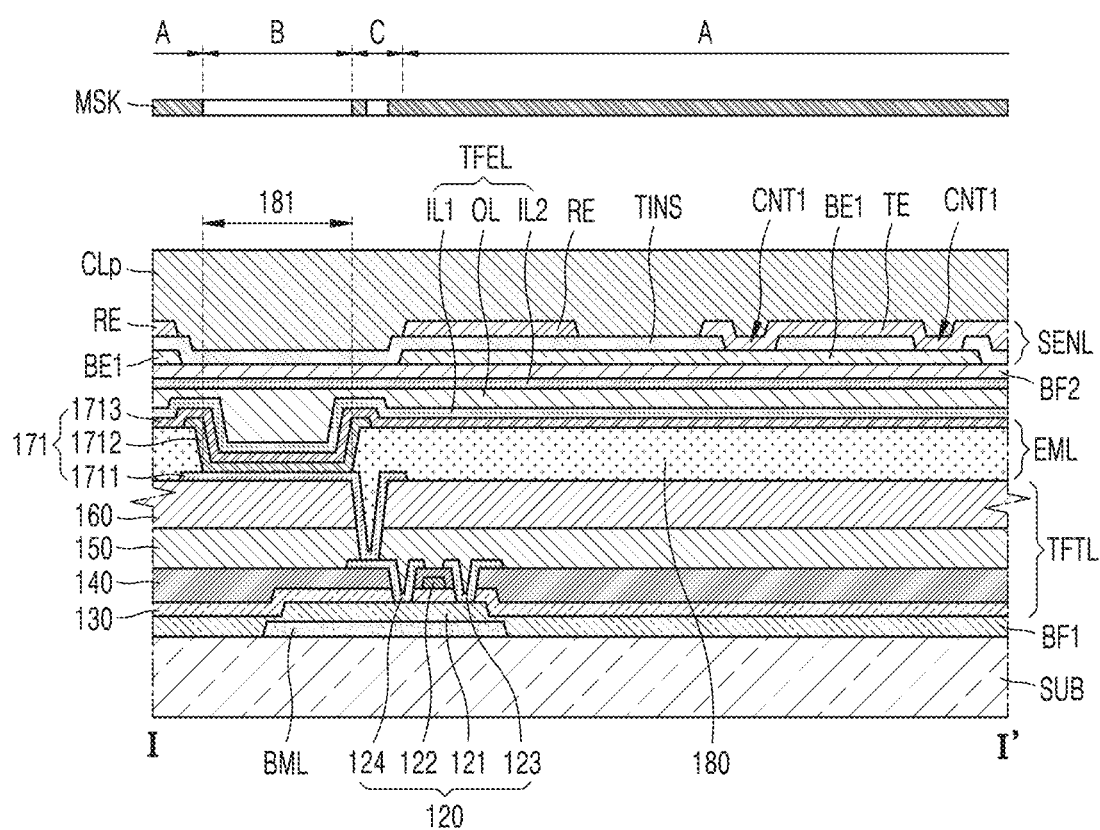
FIG. 11 is a cross-sectional view of another process of an embodiment of a method of manufacturing the display apparatus of FIG. 7.

FIG. 11 is a cross-sectional view of another process of an embodiment of a method of manufacturing the display apparatus of FIG. 7. In an embodiment of a method of manufacturing the display apparatus, as shown in FIG. 11, the first display element 171 including the first pixel electrode 1711 is formed. Subsequently, the sensor electrode layer SENL is formed. Then, the preliminary layer CLp as an insulating layer is formed, the preliminary layer CLp including a material of the first light-condensing layer CL1, and covering the sensor insulating layer TINS, the driving electrode TE, the sensing electrode RE, and the like. The preliminary layer CLp is exposed by using the mask MSK. The preliminary layer CLp may include a photoresist material. In an embodiment, for example, portions of the preliminary layer CLp that are not exposed may be removed afterward during a development process. In this case, the mask MSK may have a slit having an area corresponding to the area of the upper surface CL1d of the first light-condensing layer CL1 in the region B that is a region in which the upper surface CL1d of the first light-condensing layer CL1 is to be arranged, the mask MSK may have a slot having an area less than an area of a region C in a region that is a region in which the second first side surface CL1c having a relatively low slope with respect to the lower surface is to be formed, and the mask MSK may not have a slit in the other regions. When the preliminary layer CLp is exposed and then developed by using a slit mask as the mask MSK (i.e., the preliminary layer CLp is patterned by using a slit mask), the first light-condensing layer CL1 may be formed as shown in FIG. 7.

Figure 12:
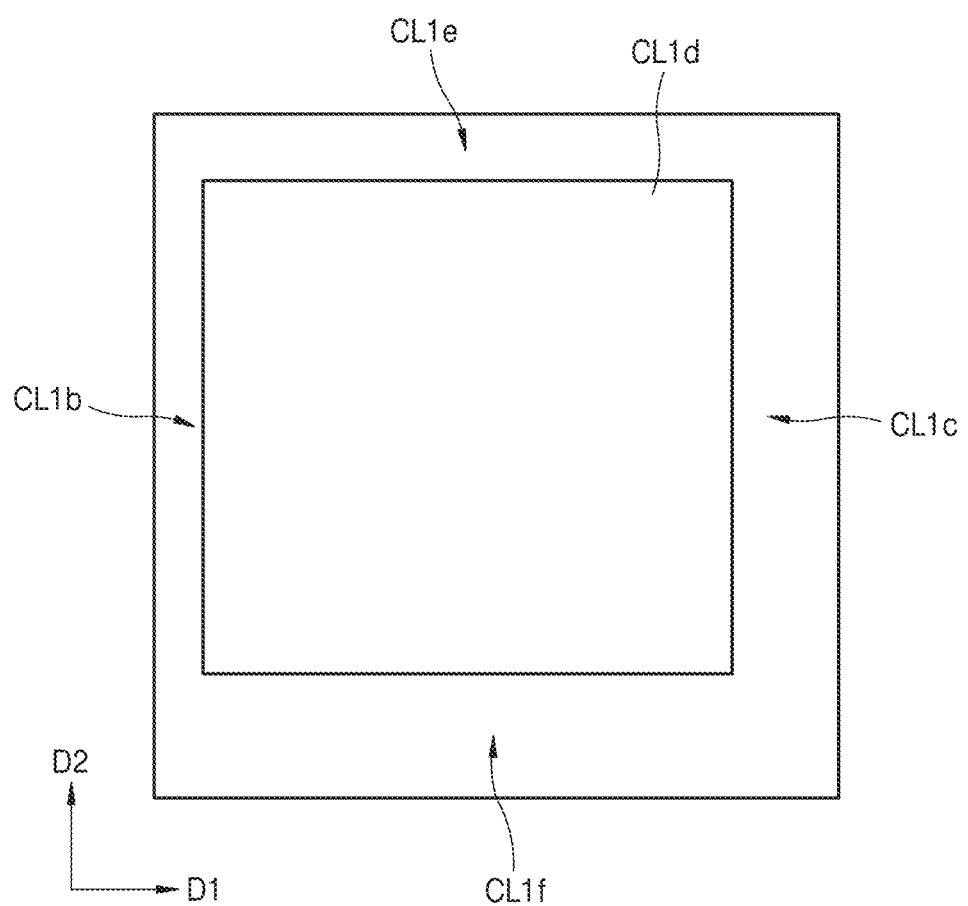
FIG. 12 is a plan view of a portion of a display apparatus according to an embodiment.

FIG. 12 is a plan view of a portion of a display apparatus according to an embodiment. In FIG. 12, an outer quadrangle denotes the edges of the lower surface of the first light-condensing layer CL1, and an inner quadrangle denotes the edges of the flat upper surface CL1d of the first light-condensing layer CL1. As described above, the first first slope angle θ1 of the first first side surface CL1b with respect to the first lower surface CL1a of the first light-condensing layer CL1 is different from the second first slope angle θ2 of the second first side surface CL1c with respect to the first lower surface CL1a and the second first side surface CL1c is the opposite side surface from the first first side surface CL1b in the first direction D1. In an embodiment, as shown in FIG. 12, in a second direction D2 parallel to the substrate SUB and crossing a first direction D1 from the first first side surface CL1b to the second first side surface CL1c of the first light-condensing layer CL1, a third first slope angle of a third first side surface CL1e of the first light-condensing layer CL1 with respect to the lower surface may be different from a fourth first slope angle of a fourth first side surface CL1f of the first light-condensing layer CL1 with respect to the lower surface. Here, the fourth first side surface CL1f is the opposite side surface from the third first side surface CL1e. In such an embodiment, a uniform condensing efficiency improvement may be achieved over the entire display area.

The third first slope angle and the fourth first slope angle may each be an acute angle. In addition, the third first slope angle may be in a third angle range, and the fourth first slope angle may be in a fourth angle range different from the third angle range. In such an embodiment, the third angle range and the fourth angle range may each be an angle range less than about 90°. The third angle range may be less than about 70°, the third angle range may be, for example, equal to or greater than about 50° and less than about 70°, and the fourth angle range may be equal to or greater than about 70°, the fourth angle range may be, for example, equal to or greater than about 70° and less than about 80°.

In an embodiment, the third first slope angle and the fourth first slope angle may be respectively different from the first first slope angle and the second first slope angle. FIG. 12 shows an embodiment where the second first slope angle by the second first side surface CL1c is greater than the fourth first slope angle by the fourth first side surface CL1f, the third first slope angle by the third first side surface CL1e is greater than the second first slope angle by the second first side surface CL1c, and the first first slope angle by the first first side surface CL1b is greater than the third first slope angle by the third first side surface CL1e.

Figure 13:
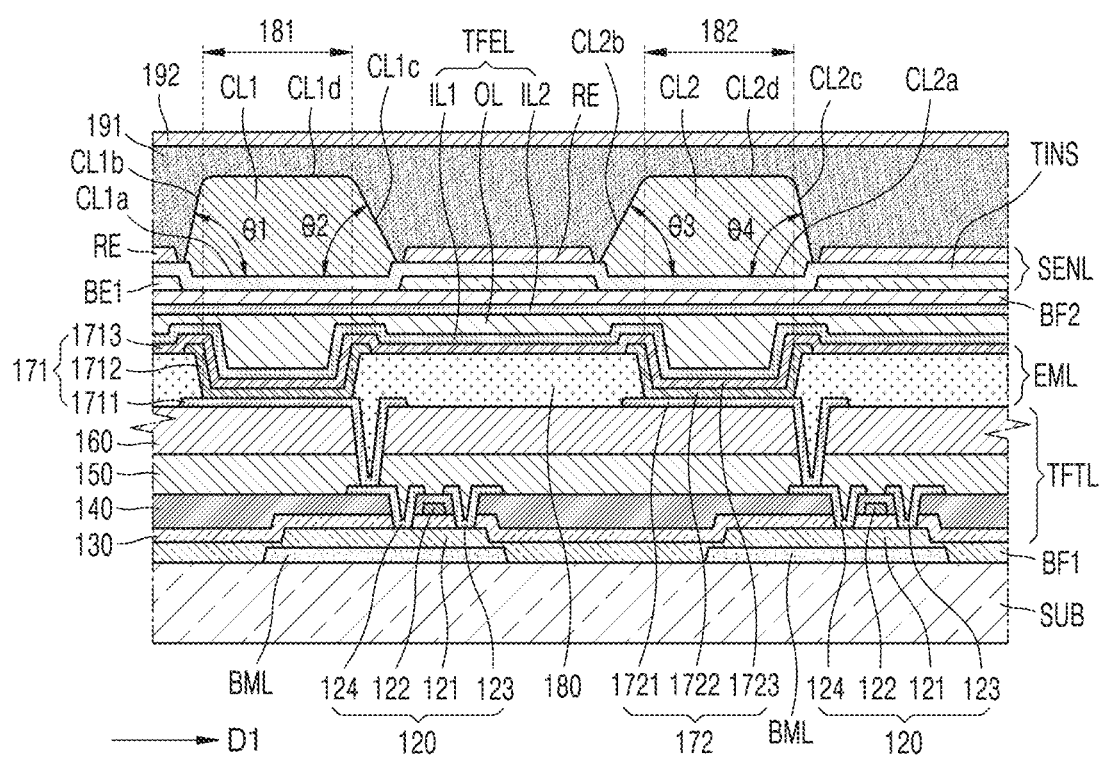
FIG. 13 a cross-sectional view of a portion of a display apparatus according to an embodiment.

FIG. 13 a cross-sectional view of a portion of a display apparatus according to an embodiment.

The emission element layer EML may include not only the first display element 171 but a second display element 172. A second pixel electrode 1721 of the second display element 172 is apart from the first pixel electrode 1711 of the first display element 171 in the first direction D1. As described above with respect to the first pixel electrode 1711, the second pixel electrode 1721 may be disposed on the second planarization layer 160. In addition, the pixel-defining layer 180 includes a second opening 182 exposing the central portion of the second pixel electrode 1721. Description of the first pixel electrode 1711, the first intermediate layer 1712 including the first emission layer, and the first opposite electrode 1713 of the first display element 171 is applicable to the second pixel electrode 1721, a second intermediate layer 1722 including a second emission layer, and a second opposite electrode 1723 of the second display element 172. The first opposite electrode 1713 and the second opposite electrode 1723 may be entirely formed as a one body.

The first light-condensing layer CL1 and a second light-condensing layer CL2 may be disposed on the sensor insulating layer TINS. Alternatively, a portion of the first light-condensing layer CL1 and/or a portion of the second light-condensing layer CL2 may be disposed over the driving electrode TE and/or the sensing electrode RE. The first light-condensing layer CL1 is disposed over the first pixel electrode 1711 to correspond to the first opening 181 of the pixel-defining layer 180. The second light-condensing layer CL2 is disposed over the second pixel electrode 1721 to correspond to the second opening 182 of the pixel-defining layer 180. In such an embodiment, the first first slope angle θ1 of the first first side surface CL1b with respect to the first lower surface CL1a of the first light-condensing layer CL1 is different from the second first slope angle θ2 of the second first side surface CL1c, which is an opposite side surface from the first first side surface CL1b, with respect to the first lower surface CL1a. A first second slope angle θ3 of a first second side surface CL2b of the second light-condensing layer CL2 in a direction (−D1 direction) to the second first side surface CL1c with respect to a second lower surface CL2a is different from a second second slope angle θ4 of a second second side surface CL2c, which is an opposite side surface from the first second side surface CL2b, with respect to the second lower surface CL2a. In addition, the first light-condensing layer CL1 has the flat upper surface CL1d, and the second light-condensing layer CL2 has a flat upper surface CL2d.

The first light-condensing layer CL1 and the second light-condensing layer CL2 may increase the brightness at the front of the display apparatus. In such an embodiment, the first first slope angle θ1, the second first slope angle θ2, the first second slope angle θ3, and the second second slope angle θ4 may each be an acute angle. In addition, a light-condensing function of the first light-condensing layer CL1 and the second light-condensing layer CL2 may be increased by covering the first light-condensing layer CL1 and the second light-condensing layer CL2 by the additional layer 191 having a refractive index less than the refractive indexes of the first light-condensing layer CL1 and the second light-condensing layer CL2. In an embodiment, for example, the first light-condensing layer CL1 and the second light-condensing layer CL2 may each have a refractive index of about 1.54, and the additional layer 191 may have a refractive index of about 1.47. A difference between the refractive indexes of the first light-condensing layer CL1 and the second light-condensing layer CL2 and the refractive index of the additional layer 191 may be about 0.06 or greater.

In an embodiment, the additional layer 191 may be, for example, a PSA. In such an embodiment, the additional layer 191 may also bond the polarizing plate 192 thereon to the sensor electrode layer SENL. The polarizing plate 192 may be the polarizing film PF described with reference to FIG. 2.

In an embodiment of the display apparatus according to the invention, the first first slope angle θ1 of the first first side surface CL1b with respect to the first lower surface CL1a of the first light-condensing layer CL1 is different from the second first slope angle θ2 of the second first side surface CL1c, which is the opposite side surface from the first first side surface CL1b, with respect to the first lower surface CL1a. The first second slope angle θ3 of a first second side surface CL2b of the second light-condensing layer CL2 in the direction (−D1 direction in FIG. 13) to the second first side surface CL1c with respect to the second lower surface CL2a is different from the second second slope angle θ4 of the second second side surface CL2c, which is the opposite side surface from the first second side surface CL2b, with respect to the second lower surface CL2a. When the first light-condensing layers CL1 and the second light-condensing layers CL2 are dispersed in the sensor area TSA, which is the display area, even though the first first slope angle θ1, the second first slope angle θ2, the first second slope angle θ3, and the second second slope angle θ4 change slightly during the manufacturing process, a uniform condensing efficiency improvement may be achieved over the entire display area.

The first first slope angle θ1 and the second second slope angle θ4 may be in the first angle range, and the second first slope angle θ2 and the first second slope angle θ3 may be in the second angle range different from the first angle range. In addition, the first angle range and the second angle range may each be an angle range less than about 90°. The first angle range may be equal to or greater than about 70°, the first angle range may be, for example, equal to or greater than about 70° and less than about 80°, and the second angle range may be less than about 70°, the second angle range may be, for example, equal to or greater than about 50° and less than about 70°.

In the case where sets of the first light-condensing layers CL1 and the second light-condensing layers CL2 are arranged in the first direction D1, the first first slope angle θ1 and the second second slope angle θ4 facing each other may be in the first angle range, and the second first slope angle θ2 and the first second slope angle θ3 facing each other may be in the second angle range. Accordingly, while reducing a brightness change according to a viewing angle change of a user positioned at the front of the display apparatus, a brightness efficiency improvement of the display apparatus may be achieved.

According to an embodiment, a display apparatus that may achieve a uniform brightness increase in a display area, and a method of manufacturing the display apparatus may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A display apparatus comprising:
a pixel electrode;
a pixel-defining layer covering edges of the pixel electrode, wherein an opening is defined through the pixel-defining layer to expose a central portion of the pixel electrode; and
a light-condensing layer disposed over the pixel electrode to correspond to the opening,
wherein a first first slope angle of a first first side surface of the light-condensing layer with respect to a lower surface of the light-condensing layer is different from a second first slope angle of a second first side surface of the light-condensing layer with respect to the lower surface of the light-condensing layer,
wherein the second first side surface is opposite to the first first side surface,
wherein the first first slope angle is in a first angle range, equal to or greater than about 70° and less than about 80°, and wherein the second first slope angle is in a second angle range, equal to or greater than about 50° and less than about 70°.

2. The display apparatus of claim 1, wherein the light-condensing layer has a flat upper surface.

3. The display apparatus of claim 1, further comprising:
an additional layer covering the light-condensing layer and having a refractive index less than a refractive index of the light-condensing layer.

4. The display apparatus of claim 3, further comprising:
a polarizing plate disposed on the additional layer,
wherein the additional layer is a pressure-sensitive adhesive layer.

5. The display apparatus of claim 1,
wherein the pixel electrode is disposed over a substrate,
wherein a third first slope angle of a third first side surface of the light-condensing layer with respect to the lower surface of the light-condensing layer is different from a fourth first slope angle of a fourth first side surface of the light-condensing layer with respect to the lower surface of the light-condensing layer,
wherein the first first side surface is opposite to the second first side surface in a first direction, and the fourth first side surface is opposite to the third first side surface in a second direction parallel to the substrate and crossing the first direction.

6. The display apparatus of claim 5, wherein each of the third first slope angle and the fourth first slope angle is an acute angle.

7. The display apparatus of claim 5, wherein
the third first slope angle is in a third angle range, and
the fourth first slope angle is in a fourth angle range different from the third angle range.

8. The display apparatus of claim 7, wherein
the third angle range is less than about 70°, and
the fourth angle range is greater than or equal to about 70°.

9. The display apparatus of claim 5, wherein each of the third first slope angle and the fourth first slope angle is different from the first first slope angle and the second first slope angle.

10. A display apparatus comprising:
a first pixel electrode and a second pixel electrode apart from each other in a first direction;
a pixel-defining layer covering edges of each of the first pixel electrode and the second pixel electrode, wherein a first opening is defined through the pixel-defining layer to expose a central portion of the first pixel electrode, and a second opening is defined through the pixel-defining layer to expose a central portion of the second pixel electrode;
a first light-condensing layer disposed over the first pixel electrode to correspond to the first opening, wherein a first first slope angle of a first first side surface of the first light-condensing layer with respect to a lower surface of the first light-condensing layer is different from a second first slope angle of a second first side surface of the first light-condensing layer with respect to the lower surface of the first light-condensing layer, and the second first side surface is opposite to the first first side surface in the first direction; and
a second light-condensing layer disposed over the second pixel electrode to correspond to the second opening, wherein a first second slope angle of a first second side surface of the second light-condensing layer with respect to a lower surface of the second light-condensing layer is different from a second second slope angle of a second second side surface of the second light-condensing layer in a direction to the second first side surface with respect to the lower surface of the second light-condensing layer, and the second second side surface is opposite to the first second side surface in the first direction,
wherein each of the first first slope angle and the second second slope angle is equal to or greater than about 70° and less than about 80°, and
wherein each of the first second slope angle and the second first slope angle is equal to or greater than about 50° and less than about 70°.

11. The display apparatus of claim 10, wherein each of the first light-condensing layer and the second light-condensing layer has a flat upper surface.

12. The display apparatus of claim 10, further comprising:
an additional layer covering the first light-condensing layer and the second light-condensing layer and having a refractive index less than a refractive index of the first light-condensing layer and the second light-condensing layer.

13. The display apparatus of claim 12, further comprising:
polarizing plate disposed on the additional layer, wherein the additional layer is a pressure-sensitive adhesive layer.

14. A method of manufacturing a display apparatus, the method comprising:
forming a pixel electrode on a substrate;
forming a pixel-defining layer covering edges of the pixel electrode on the pixel electrode, wherein an opening is formed through the pixel-defining layer to expose a central portion of the pixel electrode;
forming an insulating layer including a photoresist component over the pixel-defining layer; and
forming a light-condensing layer by patterning the insulating layer by using a half-tone mask or a slit-mask,
wherein the light-condensing layer is disposed over the pixel electrode to correspond to the opening defined by the pixel-defining layer, and
a first first slope angle of a first first side surface of the light-condensing layer with respect to a lower surface of the light-condensing layer is different from a second first slope angle of a second first side surface of the light-condensing layer with respect to the lower surface of the light-condensing layer,
the second first side surface is a side surface opposite to the first first side surface,
the first first slope angle is equal to or greater than about 70° and less than about 80°, and
the second first slope angle is range equal to or greater than about 50° and less than about 70°.

* * * * *